US007828993B2

(12) United States Patent
Roth et al.

(10) Patent No.: US 7,828,993 B2
(45) Date of Patent: Nov. 9, 2010

(54) PHOSPHOR AND OPTICAL DEVICE USING SAME

(75) Inventors: Gundula Roth, Levenhagen (DE); Walter Tews, Greifswald (DE)

(73) Assignees: Toyoda Gosei Co., Ltd., Nishikasugai-gun, Aichi (JP); Gundula Roth, Levenhagen (DE); Walter Tews, Greifswald (DE)

( * ) Notice: Subject to any disclaimer, the term of this patent is extended or adjusted under 35 U.S.C. 154(b) by 525 days.

(21) Appl. No.: 10/539,248

(22) PCT Filed: Dec. 19, 2003

(86) PCT No.: PCT/JP03/16380

§ 371 (c)(1),
(2), (4) Date: Oct. 20, 2006

(87) PCT Pub. No.: WO2004/056940

PCT Pub. Date: Jul. 8, 2004

(65) Prior Publication Data
US 2007/0035813 A1  Feb. 15, 2007

(30) Foreign Application Priority Data
Dec. 20, 2002  (DE)  .............. 102 59 946

(51) Int. Cl.
C09K 11/66 (2006.01)
(52) U.S. Cl. .................. 252/301.4 F; 252/301.4 P; 252/301.4 R
(58) Field of Classification Search .................. None
See application file for complete search history.

(56) References Cited

U.S. PATENT DOCUMENTS

| 2,755,254 | A | * | 7/1956 | Butler ................ 252/301.4 P |
| 2,785,137 | A | | 3/1957 | Ranby et al. |
| 2,865,862 | A | | 12/1958 | Mooney et al. |
| 3,858,082 | A | | 12/1974 | Thornton, Jr. |
| 3,925,239 | A | * | 12/1975 | Wanmaker et al. .... 252/301.4 P |
| 6,093,346 | A | | 7/2000 | Xiao et al. |
| 6,099,754 | A | | 8/2000 | Yocom |
| 6,616,862 | B2 | | 9/2003 | Srivastava et al. |
| 6,700,322 | B1 | * | 3/2004 | Duggal et al. ............. 313/504 |
| 6,734,465 | B1 | * | 5/2004 | Taskar et al. .............. 257/80 |
| 2002/0063301 | A1 | | 5/2002 | Hanamoto et al. |
| 2002/0105266 | A1 | | 8/2002 | Juestel et al. |
| 2002/0195938 | A1 | * | 12/2002 | Kawamura ................ 313/582 |
| 2003/0085642 | A1 | * | 5/2003 | Pelka et al. ............... 313/113 |
| 2003/0146411 | A1 | | 8/2003 | Srivastava et al. |
| 2004/0169181 | A1 | * | 9/2004 | Yoo ........................... 257/81 |

FOREIGN PATENT DOCUMENTS

| CN | 1194292 | 9/1998 |
| CN | 1298435 | 6/2001 |
| CN | 1628164 | 6/2005 |
| FR | 1 199 960 A | 12/1959 |
| GB | 833381 A | 4/1960 |
| GB | 925634 A | 5/1963 |
| JP | 31-1118 | 2/1956 |
| JP | 53-57188 | 5/1978 |
| JP | 63-30585 | 2/1988 |
| JP | 63-101476 | 5/1988 |
| JP | 63101476 | * 5/1988 |
| JP | 1-156391 | 6/1989 |
| JP | 07-324186 | 12/1995 |
| JP | 10-112557 | 4/1998 |
| JP | 2001-308393 | 11/2001 |
| JP | 2002-118292 | 4/2002 |
| JP | 2002-171000 | 6/2002 |
| JP | 2002-223008 | 8/2002 |
| TW | 00140127 | 2/1988 |
| TW | 00166710 | 6/1989 |
| WO | WO97/27267 | 7/1997 |
| WO | WO 99/50371 | 10/1999 |
| WO | WO 01/89001 A2 | 11/2001 |
| WO | WO 2004/003106 | 1/2004 |

OTHER PUBLICATIONS

Japanese Notification of Reasons for Refusal dated Feb. 7, 2007 with Engllish translation.
European Search Report dated Mar. 16, 2009.
Kotera, "Studies on the Oxy-acid Phosphors VI. Antimonante Phosphors", vol. 29, No. 6, 1956, pp. 742-744.

(Continued)

Primary Examiner—Sikha Roy
Assistant Examiner—Donald L Raleigh
(74) Attorney, Agent, or Firm—McGinn IP Law Group, PLLC

(57) ABSTRACT

A phosphor for converting ultraviolet light or blue light emitted from a light emitting element into a visible white radiation having a high level of color rendering properties, containing a light emitting component prepared from a solid system of an alkaline earth metal antimonate and a system derived from the solid system and exhibiting intrinsic photoemission, such as a fluoroantimonate, a light emitting component prepared from a manganese(IV)-activated antimonate, a titanate, silicate-germanate, and an aluminate, a light emitting component prepared from a europium-activated silicate-germanate or from a system containing a sensitizer selected from a group consisting of europium (II) and manganese (II) as a secondary activator and having an orange color or a dark red color in the spectrum range over 600 nm, or a light emitting component composed of a mixture of eight or less light emitting components having different emission bands and brought to a state of continuous emission of about 380 to 780 nm exhibiting a color temperature of about 10,000 to 6,500 K and a color temperature of about 3,000 to 2,000 K by virtue of the superposition of the light emitting bands.

17 Claims, 18 Drawing Sheets

OTHER PUBLICATIONS

A.F. Holleman, E. Wiberg, "Lehrbuch der Anorganischen Chemie", 1995, Walter DE Gruyter, Berlin New York 101, XP002511987, p. 1082, paragraph 6-p. 1083, paragraph 1 with an English translation.

XP008100644, (C.R. Acad. Sc. Paris t. 263) pp. 496-498 with an English translation.

XP008100637, (C.R. Acad. Sc. Paris t. 258) p. 4956, lines 1-4 and lines 27-30, Figure 1 with an English translation.

Yamada, et al., "A Long—persistent Blue Phosphor SRSB2O6:MN2+", Sep. 21, 1988, p. 820.

European Office Action dated Nov. 17, 2009.

Chinese Office Action dated May 23, 2008 with English translation.

* cited by examiner

PHOSPHOR AND OPTICAL DEVICE USING SAME

This application is based on German patent application No. (DE10259946.7), the entire disclosures of which are incorporated herein by reference.

TECHNICAL FIELD

The invention relates to a phosphor and further a phosphor mixture, and use of the phosphor or phosphor mixture for converting ultraviolet and blue radiations emitted from a light emitting element capable of constituting an ultraviolet or blue light emitting semiconductor element or a gas discharge lamp, to a visible white radiation having a very high level of color rendering properties substantially equal to that from a natural light source or an incandescent lamp, and the invention also relates to an optical device using the same.

BACKGROUND ART

U.S. Pat. Nos. 5,998,925 and 6,409,938 disclose white light emitting semiconductor elements. White light emitted from these elements is mainly produced from a combination of a blue light emitting semiconductor element with a phosphor coating comprising yellow light emitting phosphor YAG of yttrium aluminum garnet. These white light emitting semiconductor elements are disadvantageous in that the color rendering properties of produced white light are unsatisfactory and, thus, the color rendering index Ra is as low as less than 80. Further, white light having a color temperature above 6000 K produced in these elements is very cold light. This is particularly attributable to the absence of a further color component. In these elements, white light having a color temperature below 5000 K cannot be provided at all.

DE10026435 A1 discloses a phosphor in which simultaneous use of YAG as a yellow light emitting component in a phosphor mixture can realize the conversion of a blue or ultraviolet primary radiation to green light and, at the same time, can increase the color rendering index Ra to about 81.

In DE10026435 A1 and WO00/33389 and WO00/33390, the principle of RGB is applied to produce white light having good quality through a combination of a blue light emission band, a green light emission band and a red light emission band. Further, based on this principle, a yellow component may be used instead of the red component to produce a white light emitting semiconductor element which emits white light with a color rendering index Ra of 81 to 87. In this case, in the spectrum, there is substantially no contribution of the red component to a frequency range.

U.S. Pat. No. 6,084,250 discloses white LED that basically emits an ultraviolet primary radiation and, by virtue of use of a certain phosphor mixture, can realize a color rendering index Ra up to 90 based on the principle of RGB. In this phosphor mixture, in addition to a blue light emitting phosphor BAM comprising a divalent europium-activated barium magnesium aluminate, a sulfide- or Eu(III)-activated red light emitting phosphor is mainly used.

Likewise, U.S. Pat. No. 6,255,670 discloses a blue component, a green component, and a narrow band red component for the production of white light.

In all of these teachings, when the principle of RGB known from television technology and conventional lighting is used and, further, the spectrum is supplemented with a blue-green component, the color rendering index Ra is disadvantageously as low as 89 to 90 at the highest because necessary broadband red component and other light emitting components are absent. When the principle of RGB and a narrow band Eu(III)-activated red component having a line structure in the range of about 610 nm to 625 nm are used, as a general rule, any better white light cannot be produced. It is also known that the sulfide phosphor does not have necessary long-term stability and, thus, the amount of a light emitting flux in the semiconductor element rapidly decreases with the elapse of lighting time, resulting in lowered service life of LED.

It is an object of the invention to eliminate all of these drawbacks and to provide phosphors suitable for use as means for converting ultraviolet and blue radiations to white light in a primary light emitting element that emit light at 300 nm to 500 nm and to provide a phosphor mixture composed mainly of them. The phosphors should produce light having color rendering properties close to those in natural light or incandescent lamp light, and a color rendering index Ra above 90 and color rendering Ia according to CRI standard should be satisfied.

It is another object of the invention to provide an optical device that can convert ultraviolet and blue radiations to white light in a primary light emitting element which emits light at 300 nm to 500 nm and, at the same time, can emit a visible white radiation having a high level of color rendering properties.

DISCLOSURE OF THE INVENTION (A) According to the invention, in a primary light emission constituting element capable of constituting a semiconductor element or a gas discharge lamp, two methods for converting ultraviolet and blue radiations to a visible white radiation having a high level of color rendering properties are provided.

1. Use of a phosphor which exhibits broad band light emission in an orange-red or red spectrum region or a narrower band light emission in a dark red spectrum region with more than 650 nm, and 2. use of a phosphor mixture comprising eight or less phosphor components which has been produced using phosphors of the above type and exhibits a state of broad continuous emission of about 380 to 780 nm. Superimposition of different emission bands produces a spectrum having a color temperature of about 10,000 K with blue-white color to 6,500 K with daylight color and a color temperature of about 3,000 K with warm white color to 2,000 K with twilight color of yellowish red and, at the same time, can realize maintenance of color rendering Ia.

Phosphors in the light emitting component suitable for conversion of ultraviolet and blue radiations to a visible white radiation having a high level of color rendering properties are phosphors for a red spectrum region that comprise a solid system and exhibit intrinsic photoemission or have been activated by manganese(IV) or titanium(IV).

Further means for converting ultraviolet and blue radiations to a visible white radiation having a high level of color rendering properties is produced by a system using a sensitizer selected from the group consisting of Eu(II) and Mn(II) as a secondary activator.

Phosphor systems which emit light in a useful broadband emission orange, orange-red and red component or dark red spectrum region include:

alkaline earth metal antimonates, Mn(IV)-activated phosphors, and phosphors which have been subjected to double activation with Eu and Mn.

The above phosphors may comprise any of or a combination of the following limited phosphors.

1) Suitable alkaline earth metal antimonates according to the invention and systems derived from them, for example, fluoroantimonates, exhibit intrinsic photoemission and are represented by general formula $$Me^I_x Me^{II}_y Sb_a O_b X_c$$

wherein

Me$^I$ is at least one element selected from the group consisting of calcium (Ca), strontium (Sr), barium (Ba), cadmium (Cd), zinc (Zn), beryllium (Be), magnesium (Mg), europium (Eu), manganese (Mn), scandium (Sc), yttrium (Y), lanthanum (La), samarium (Sm), praseodymium (Pr), dysprosium (Dy), and terbium (Tb), Me$^{II}$ is at least one element selected from the group consisting of lithium (Li), sodium (Na), potassium (K), rubidium (Rb), and cesium (Cs), X (uppercase letter) represents at least one element selected from the group consisting of fluorine (F), chlorine (Cl), and bromine (Br), x (lowercase letter)=0 (zero) to 8,
y=0 to 4,
0<a<16,
0<b<64,
0≦c≦4, and a part of antimony (Sb) may be replaced with vanadium (V), niobium (Nb), tantalum (Ta), phosphorus (P), arsenic (As), titanium (Ti), zirconium (Zr), hafnium (Hf), silicon (Si), germanium (Ge), molybdenum (Mo), or tungsten (W).

2) The antimonate and the fluoroantimonate emit light in a broadband in a red spectrum region that has a half-height width of about 100 to 150 nm and a maximum value of about 600 to 670 nm.

According to the invention, antimonates and fluoroantimonates as the phosphor are $CaSb_2O_6$,
$Ca_2Sb_2O_7$,
$(Ca,Sr)Sb_2O_6$,
$(Ca,Sr,Ba)_2Sb_2O_7$,
$Ca_2Sb_2O_6F$,
$Ca_{1.5}Mg_{0.5}Sb_2O_6F$,
$Ca_2Sb_2O_6F_{0.5}Cl_{0.5}$,
$Ca_{1.8}Mg_{0.2}Sb_2O_7$,
$Ca_{1.95}Li_{0.1}Sb_2O_7$, $Ca_2(Sb_{1.95}P_{0.05})O_7$,
$Ca_2Sb_{1.98}Bi_{0.02}O_7$,
$Ca_{1.95}Sr_{0.05}Sb_{1.98}Nb_{0.02}O_7$,
$Ca_{1.98}Li_{0.02}Sb_{1.98}Si_{0.02}O_7$,
$Ca_{1.98}K_{0.02}Sb_{1.98}Ge_{0.02}O_7$,
$Ca_{1.95}Mg_{0.04}Li_{0.01}Sb_{1.99}Ti_{0.01}O_7$,
$MgSb_2O_6$,
$MgSb_2O_7$
$Sr_{1.9}Zn_{0.1}Sb_2O_7$,
$Ca_{1.96}Eu_{6.04}Sb_2O_7$, and
$Ca_{0.97}Eu_{0.03}Sb_2O_6$.

3) According to the invention, phosphors useful for converting an ultraviolet or blue emitted light to a visible white radiation having a very high level of color rendering properties further include a manganese(IV)-activated antimonate. These phosphors exhibit an emission band in a dark red spectrum region of about 600 to 700 nm or a narrow structured light emission with about 650 to 660 nm.

These phosphors are, for example,
$CaSb_2O_6$:0.01Mn,
$Mg_2Sb_2O_7$:0.01Mn,
$Mg_{1.8}Li_{0.4}Sb_2O_6$:0.01Mn,
$(Ca,Sr)Sb_2O_7$:0.01Mn,
$CaSb_2O_6F$:0.01Mn,
$Ca_2(Sb_{1.98}Si_{0.02})O_7$:0.01Mn, and
$(Ca,Sr)Sb_{1.98}Ge_{0.20}O_7$:0.01Mn.

4) The phosphor according to the invention comprising a manganese(IV)-activated titanate for converting an ultraviolet or blue emitted light to a visible white radiation having a very high level of color rendering properties is represented by general formula $$Me^I_x Me^{II}_y Ti_{1-a} O_4 X_m : Mn_z$$

wherein

Me$^I$ is at least one divalent cation selected from the group consisting of Ca, Sr, Ba, Eu, Be, Mg, and Zn, or at least one trivalent cation selected from group III metals of the Periodic Table, for example, Sc, Y, and La and Gd, Sm, Dy, and Pr, Me$^{II}$ is at least one monovalent cation selected from the group consisting of alkali metals, X is an ion selected from F and Cl for charge balancing,
0≦x≦4,
0≦y≦4,
0≦m≦4,
0≦a≦1, and
0<z≦0.5, Mn is manganese with a valence of 2 to 4 and incorporated into the lattice, and titanium may be completely or partially replaced with Zr, Hf, Si, or Ge, and may be partially replaced with B (boron), Al (aluminum), Ga (gallium), In (indium), P, Nb, Ta, or V, provided that, in this case, in the cation partial lattice, there is a proper charge balance or a halogen is further incorporated.

Useful phosphors comprising a manganese(IV)-activated titanate are:

$Mg_2TiO_4$,
$MgZnTiO_4$,
$Mg_{1.8}Li_{0.4}TiO_4$,
$MgBeTiO_4$,
$CaMgTiO_4$,
$Sr_{1.8}Li_{0.2}TiO_4$,
$Mg_2Ti_{1.98}Zr_{0.02}O_4$, and
$MgZnTi_{0.98}Si_{0.02}O_4$.

5) According to the invention, phosphors useful for converting an ultraviolet or blue emitted light to a visible white radiation having a very high level of color rendering properties include phosphors comprising a red light emitting manganese(IV)-activated silicate-germanate represented by general formula $$Me^I_x Me^{II}_y Ge_{1-a} O_z X_m : Mn_w$$

wherein

Me$^I$ is at least one divalent and/or trivalent metal selected from group II or III metals of the Periodic Table and/or a lanthanide ion selected from the group consisting of Eu, Pr, Sm, Gd, and Dy, Me$^{II}$ is at least one monovalent cation, X is at least one anion selected from Cl and F elements,
0≦w≦0.5,
0<x≦28,
0≦y≦14,
0≦m≦20,
0≦a<1,
0<z≦48, and Ge may be completely or partially replaced with Si, Zr, or Ti, and/or may be partially replaced with B, Al, Ga, P, V, Nb, Ta, W, or Mo.

Such phosphors are:
$Ca_2Si_{0.9}Ge_{0.1}O_4:0.005Mn$,
$Mg_2Si_{0.5}Ge_{0.5}O_4:0.005Mn$,
$CaSrSi_{0.1}Ge_{0.9}O_4:0.003Mn$,
$MgZnSiO_4:0.003Mn$,
$MgSiO_3:0.005Mn$,
$CaMgSi_{0.95}Ge_{0.05}O_4:0.003Mn$,
$Mg_{28}Ge_{9.45}Si_{0.55}O_{48}:0.005Mn$,
$Mg_{28}Ge_9SiO_{48}:0.005Mn$,
$Mg_{28}Ge_{7.2}Si_{0.3}O_{38}F_{10}:0.003Mn$, and
$Mg_{24}Zn_4Ge_{6.5}SiO_{38}F_{10}:0.005Mn$.

6) According to the invention, phosphors useful for converting an ultraviolet or blue emitted light to a visible white radiation having a very high level of color rendering properties further include a europium-activated silicate-germanate capable of emitting a light among lights ranging from orange light to orange-red light with a broadband light emitting spectrum at 588 to 610 nm.

These phosphors are, for example,
$Ca_{0.6}Sr_{1.3}Ba_{0.06}Zn_{0.02}Si_{0.9}Ge_{0.1}O_4: 0.02Eu$,
$Ca_{0.6}Sr_{1.2}Ba_{0.1}Zn_{0.08}Si_{0.95}Ge_{0.05}O_4: 0.02Eu$,
$Ca_{0.61}Sr_{1.3}Ba_{0.04}Mg_{0.01}Zn_{0.01}Si_{0.97}Ge_{0.01}O_4:0.03Eu$,
$Ca_{0.8}Sr_{0.11}Ba_{0.04}Be_{0.01}Li_{0.1}Si_{0.99}Ge_{0.01}O_4:0.03Eu$,
$Ca_{1.0}Sr_{0.95}Zn_{0.02}Si_{0.95}Ge_{0.95}O_4:0.03Eu$,
$Ca_{0.9}Sr_{0.9}Ba_{0.08}Mg_{0.05}Zn_{0.05}Ge_{0.45}Si_{0.55}O_4:0.02Eu$,
$Ca_{1.0}Sr_{0.7}Ba_{0.1}Mg_{0.07}Zn_{0.1}Ge_{0.7}Si_{0.3}O_4:0.03Eu$,
$Ca_{0.65}Sr_{1.28}Ba_{0.02}Li_{0.04}Ge_{0.8}Si_{0.2}O_4:0.03Eu$, and
$Ca_{1.2}Sr_{0.7}Ba_{0.03}Be_{0.05}Ge_{0.05}Si_{0.99}O_4:0.02Eu$.

7) According to the invention, phosphors useful for converting an ultraviolet or blue emitted light to a visible white radiation having a very high level of color rendering properties further include a red light emitting manganese(IV)-activated aluminate or orange light emitting manganese(II)-activated aluminate having a simple spinel-type structure up to a hexagonal structure represented by general formula $$Me^I_x Me^{II}_y Al_m O_n:Mn$$

wherein
$Me^I$ is at least one element selected from group II or III metals of the Periodic Table and/or at least one lanthanide ion selected from the group consisting of Eu, Pr, Sm, Gd, Dy, and Ce,
$Me^{II}$ is at least one monovalent cation,
$0 \leq x \leq 8$,
$0 \leq y \leq 4$,
$0 < m \leq 16$,
$0 < n \leq 27$,
$0 < z \leq 0.5$, and
Al may be completely or partially replaced with B and/or Ga and/or may be partially replaced with P, V, Nb, Ta, Si, Ge, W, or Mo.

Such phosphors are:
$MgAl_2O_4$,
$CaAl_{12}O_{19}$,
$SrAl_{12}O_{19}$,
$MgAl_{12}O_{19}$,
$BeAl_{12}O_{19}$,
$SrAl_2O_4$,
$Sr_{0.5}Mg_{0.5}Al_2O_4$,
$Sr_4Al_{14}O_{25}$,
$Mg_2Al_{10}O_{17}$,
$SrMgAl_{10}O_{17}$,
$Sr_2MgAl_{16}O_{27}$,
$2SrO.3Al_2O_3$, $BaO.4Al_2O_3$ and $MgGa_2O_4$.

8) According to the invention, phosphors useful for converting an ultraviolet or blue emitted light to a visible white radiation having a very high level of color rendering properties further include a phosphor comprising a europium-manganese double activated phosphor. In this europium-manganese double activated phosphor, light, emitted from a manganese(II) ion, in a color among colors ranging from yellow to red colors as either a separate emission band or a shoulder in a long wavelength region of primary light emission is sensitized with a primary activator in which the emission band overlaps with at least one characteristic excitation band of manganese(II) and emission of light from Eu is produced in a blue to green spectrum region.

These are phosphors that comprise a borate-silicate-phosphate which has been activated by europium and manganese and is represented by general formula $$Me^I_x Me^{II}_y (B,Si,P)_a O_n X_m:Eu,Mn$$

wherein
$Me^I$ is at least one element selected from group II and/or group III metals of the Periodic Table and/or at least one lanthanide ion selected from the group consisting of Eu, Pr, Sm, Gd, Dy, and Ce,
$Me^{II}$ is at least one monovalent cation,
X is Cl, F, or Br,
$0 \leq x \leq 10$,
$0 \leq y \leq 12$,
$0 < a \leq 6$,
$0 \leq m \leq 16$,
$0 < n \leq 24$, and
B may be completely or partially replaced with P, Si, Ga, or Al and may be partially replaced with V, Nb, Ta, Ge, W, or Mo.

Such phosphors usable herein are, for example,
$SrBaP_2O_7:Eu,Mn$,
$Sr_2P_{1.68}B_{0.32}O_{7.84}:Eu,Mn$,
$Sr_4Si_3O_8Cl_4:Eu,Mn$,
$Ba_3Mg(Si,P,Ge)_2O_8:Eu,Mn$,
$(Sr,Ba)Al_2Si_2O_8:Eu,Mn$,
$Sr_{10}(PO_4)_6Cl_2:Eu,Mn$,
$(Ba,Ca,Mg)_{10}(PO_4)_6Cl_2:Eu,Mn$,
$Ca_3(PO_4)_2CaCl_2:Eu,Mn$,
$Ba_{1.3}Sr_{0.75}Ca_{0.75}Mg_{0.9}Zn_{0.1}Si_{1.9}Ge_{0.1}O_8:Eu,Mn$,
$Ba_{2.8}MgSi_{1.8}Ge_{0.2}O_8:Eu,Mn$,
$Sr_2ZnSi_{1.6}Ge_{0.4}O_7:Eu,Mn$,
$Ba_2Zn_{0.5}Mg_{0.5}Ge_{1.2}Si_{0.8}O_7:Eu,Mn$,
$Ba_3MgSi_{0.5}Ge_{0.5}O_8:Eu,Mn$,
$BaZrO_3:Eu,Mn$,
$Ba_3P_2O_8:Eu,Mn$,
$\alpha\text{-}Ca_2P_2O_7:Eu,Mn$,
$Ba_5Ca_3Si_4O_{16}:Eu,Mn$, and
$Ba_3SiO_5:Eu,Mn$.

9) The use of a novel phosphor or a plurality of novel phosphors having different emission bands as a component in a mixture for converting an ultraviolet or blue light emitted from a light emitting element to a visible white radiation with color rendering Ia and a color rendering index Ra>90, and, therefore, in the production of white light emitting LEDs can realize the use of these LEDs as a background illumination device according to the invention and, further, in lighting in a living space and furnishings, in photography and microscopic examination, in medical technology, and in lighting technology in museums and any place where a very authentic color rendering is important.

(B) According to another aspect of the invention,
there is provided an optical device comprising a wavelength converting part, said wavelength converting part comprising a phosphor capable of emitting light excited based on light emitted from an LED element, characterized in that said wavelength converting part comprises a light emitting component prepared from a solid system of an alkaline earth metal antimonate and a system derived from the solid system exhibiting intrinsic photoemission, such as a fluoroantimonate, a light emitting component prepared from a manganese(IV)-activated antimonate, a titanate, silicate-germanate, and an aluminate, a light emitting component prepared from a europium-activated silicate-germanate or from a system containing a sensitizer selected from a group consisting of Eu(II) and Mn(II) as a secondary activator and having an orange color, an orange-red color, a red color, or a dark red color in the spectrum range over 600 nm, or a phosphor with a different emission band.

(C) According to still another aspect of the invention, there is provided an optical device characterized by comprising
an LED element,
a power feeding part for mounting said LED element thereon and feeding power to said LED element,
a light transparent sealing part for sealing said LED element and said power feeding part integrally with each other, and
a wavelength converting part for emitting light upon excitation based on light emitted from said LED element, said wavelength converting part comprising a light emitting component prepared from a solid system of an alkaline earth metal antimonate and a system derived from the solid system exhibiting intrinsic photoemission, such as a fluoroantimonate, a light emitting component prepared from a manganese(IV)-activated antimonate, a titanate, silicate-germanate, and an aluminate, a light emitting component prepared from a europium-activated silicate-germanate or from a system containing a sensitizer selected from a group consisting of Eu(II) and Mn(II) as a secondary activator and having an orange color, an orange-red color, a red color, or a dark red color in the spectrum range over 600 nm, or a phosphor with a different emission band.

(D) According to a further aspect of the invention, there is provided an optical device characterized by comprising
an LED lamp,
a light guiding part for guiding light emitted from said LED lamp,
a wavelength converting part for emitting light upon excitation based on light guided through said light guiding part, said wavelength converting part comprising a light emitting component prepared from a solid system of an alkaline earth metal antimonate and a system derived from the solid system exhibiting intrinsic photoemission, such as a fluoroantimonate, a light emitting component prepared from a manganese(IV)-activated antimonate, a titanate, silicate-germanate, and an aluminate, a light emitting component prepared from a europium-activated silicate-germanate or from a system containing a sensitizer selected from a group consisting of Eu(II) and Mn(II) as a secondary activator and having an orange color, an orange-red color, a red color, or a dark red color in the spectrum range over 600 nm, or a phosphor with a different emission band, and
a part to be lighted based on light emitted through said wavelength converting part.

BEST MODE FOR CARRYING OUT THE INVENTION

The phosphor and the optical device using the same according to the invention will be explained in detail in conjunction with the drawings and the like.

The preparation of a phosphor for converting ultraviolet and blue radiations to a visible white radiation having a high level of color rendering properties in LED or other primary light emitting element will be first explained:

Alkaline Earth Metal Antimonate

An alkaline earth metal antimonate is prepared from an oxide, a carbonate or other compound capable of forming a metal oxide upon thermal decomposition and a proper metal halide.

The preparation of calcium metantimonate, calcium pyroantimonate, and calcium fluoroantimonate, which are basic compounds comprising calcium as a cation, as representative examples of other antimonate phosphors will be explained.

Calcium metantimonate $CaSb_2O_6$ is prepared from antimony tetraoxide and calcium carbonate by two-stage calcination under an oxidizing atmosphere comprising 50% of air or nitrogen and 50% of oxygen. The two-stage calcination is carried out by calcining a stoichiometric amount of a starting material mixture at 985° C. for one hr and then calcining the homogenization intermediate at 1200° C. for 8 hr. This reaction proceeds according to the following formulation:

$$Sb_2O_4 + CaCO_3 + \tfrac{1}{2}O_2 \rightarrow CaSb_2O_6 + CO_2$$

Thereafter, the product thus obtained is ground and is washed to dissolve and remove the oxide remaining unconverted. The dried and sieved phosphor has a slightly yellowish color.

of an oxide thereof or such a compound form that forms an oxide upon thermal decomposition.

When tetravalent acid forming agents, for example, Ti, Zr, Hf, Si, and Ge, are incorporated, simultaneous addition of these agents and monovalent metal ions can realize charge balance, and, when Mo and W are incorporated, simultaneous addition of these elements and trivalent cations is sometimes advantageous.

Further, when trivalent cations are used, care should be taken in charge balance by monovalent metal ions or an additional halogen atom.

Luminescence characteristics of antimonate phosphors are shown in Table 1.

TABLE 1

Figure 1:
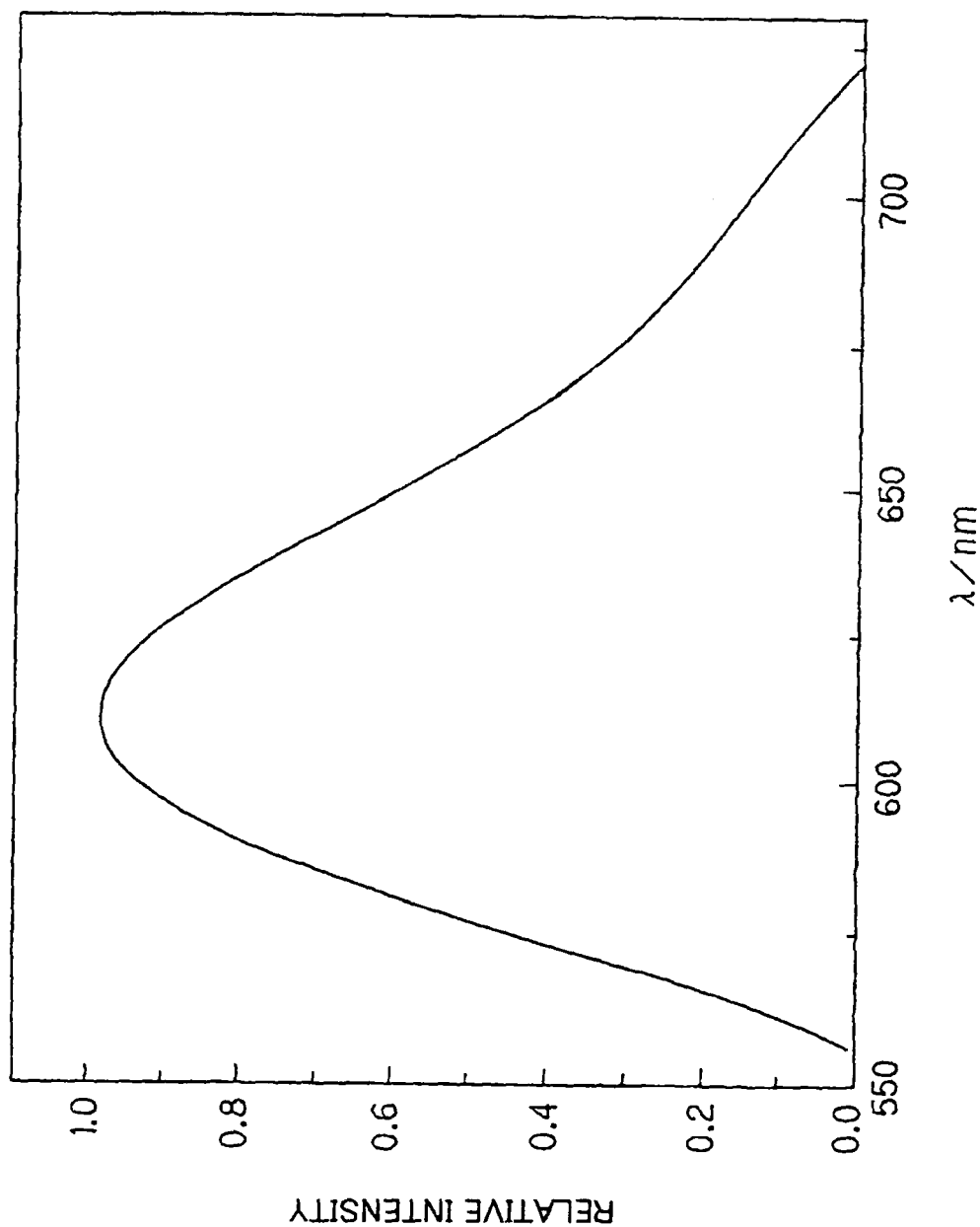
FIG. 1 is an emission spectrum of a calcium fluoroantimonate phosphor.
Figure 2:
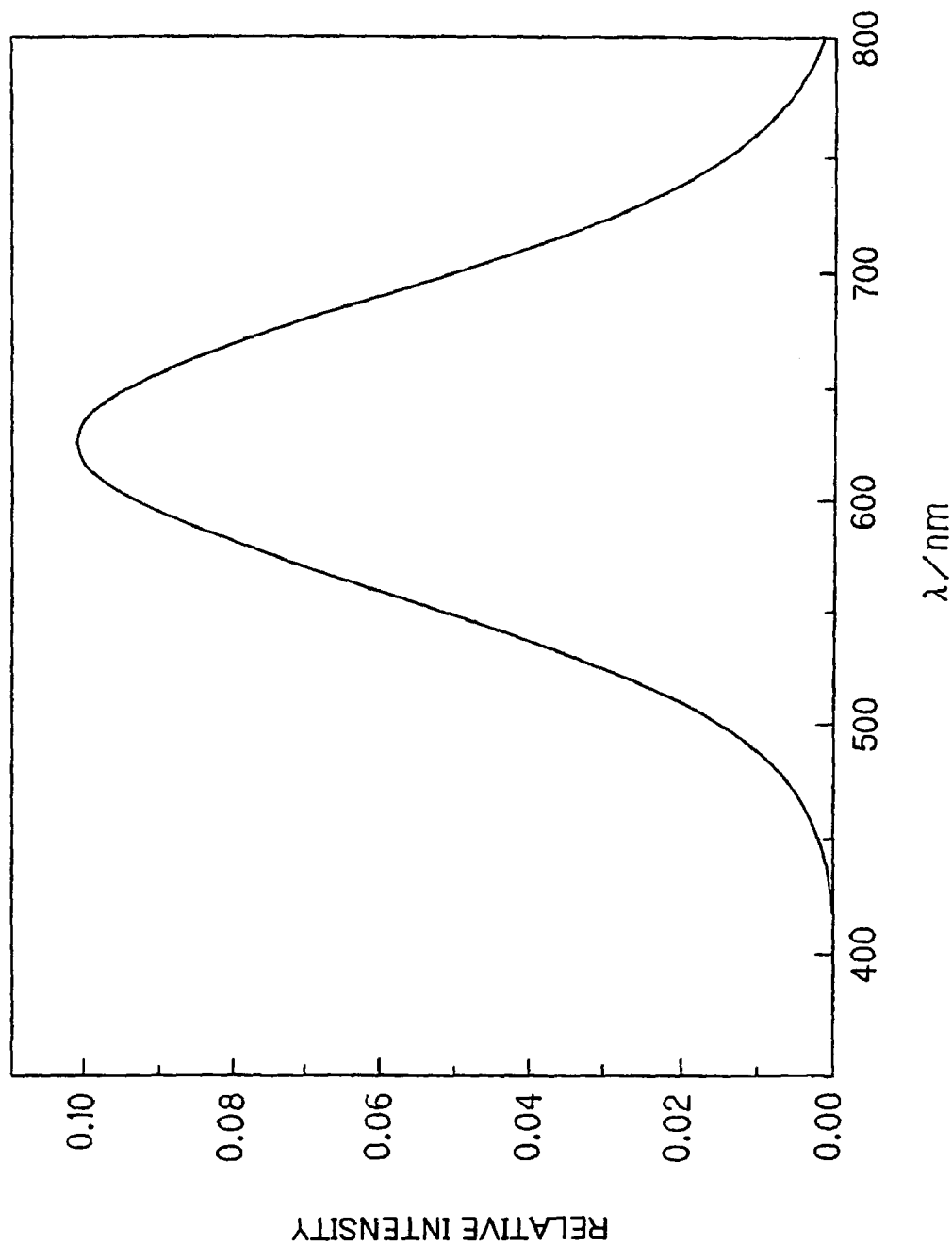
FIG. 2 is an emission spectrum of a calcium pyroantimonate phosphor.
Figure 3:
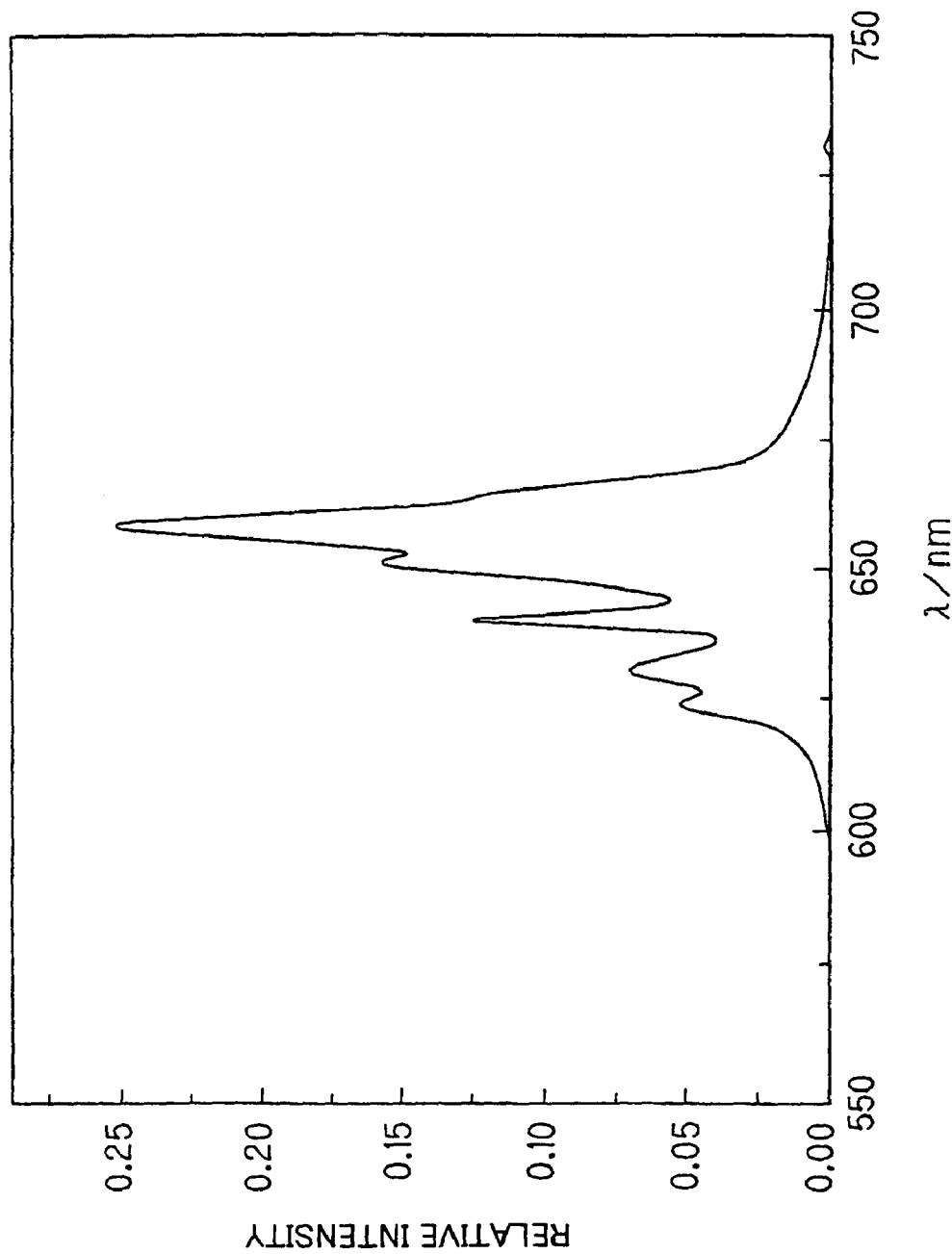
FIG. 3 is an emission spectrum of an $Mg_{1.8}Li_{0.4}Sb_2O_6$: 0.01Mn(IV) phosphor.
Figure 4:
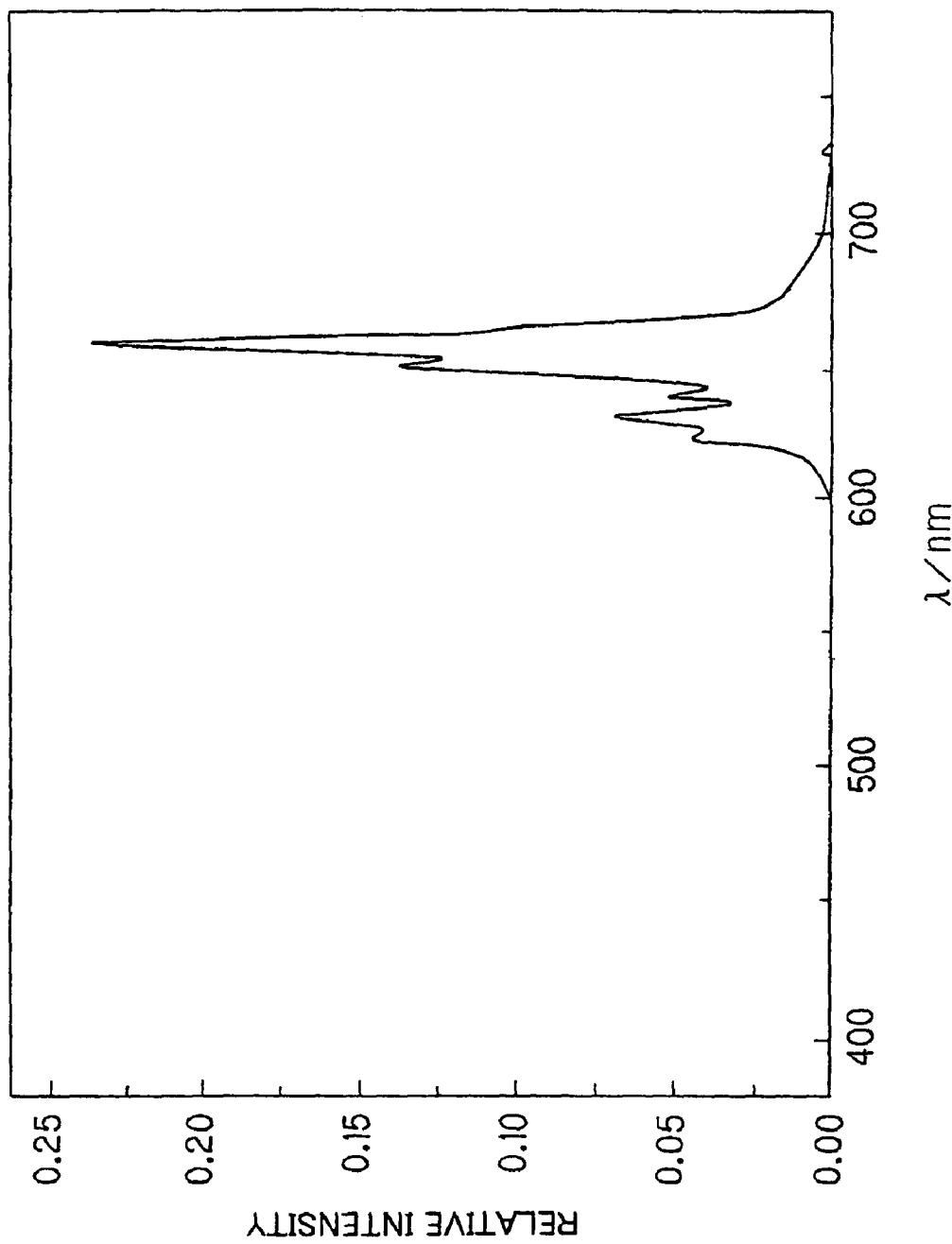
FIG. 4 is an emission spectrum of a magnesium titanate: Mn(IV) phosphor.

| Phosphor | Solid color | Maximum emission, nm | Half-height width, nm | Remarks |
|---|---|---|---|---|
| $Ca_2Sb_2O_6F$ | Yellowish white | 620 | >130 | FIG. 1 |
| $Ca_2Sb_2O_7$ | Yellowish color | 640 | >140 | FIG. 2 |
| $(Ca,Sr)Sb_2O_6$ | Whitish yellow | 638 | >150 | |
| $(Ca,Sr,Ba)_2Sb_2O_7$ | Whitish yellow | 645 | >150 | |
| $CaSb_2O_6$ | Yellowish white | 635 | >150 | |
| $Ca_{1.5}Mg_{0.5}Sb_2O_6F$ | Yellowish color | 618 | >140 | |
| $Ca_2Sb_2O_6F_{0.5}Cl_{0.5}$ | Yellowish color | 628 | >150 | |
| $Ca_{1.8}Mg_{0.2}Sb_2O_7$ | Yellowish color | 643 | >130 | |
| $Ca_{1.95}Li_{0.1}Sb_2O_7$ | Yellowish color | 650 | >130 | |
| $Ca_2(Sb_{1.95}P_{0.05})O_7$ | Yellowish color | 625 | >140 | |
| $Ca_2Sb_{1.98}Bi_{0.02}O_7$ | Yellowish color | 630 | >150 | |
| $Ca_{1.95}Sr_{0.05}Sb_{1.98}Nb_{0.02}O_7$ | Yellowish color | 635 | >140 | |
| $Ca_{1.98}Li_{0.02}Sb_{1.98}Si_{0.02}O_7$ | Yellowish color | 622 | >130 | |
| $Ca_{1.98}K_{0.02}Sb_{1.98}Ge_{0.02}O_7$ | Yellowish color | 640 | >150 | |
| $Ca_{1.95}Mg_{0.04}Li_{0.01}Sb_{1.99}Ti_{0.01}O_7$ | Yellow | 635 | >130 | |
| $MgSb_2O_6$ | Whitish yellow | 625 | >120 | |
| $Sr_{1.9}Zn_{0.1}Sb_2O_7$ | Yellowish white | 628 | >140 | |
| $Ca_{1.96}Eu_{0.04}Sb_2O_7$ | Whitish yellow | 585-625 | >140 + 10 | $Eu^{3+}$ line emission |
| $Ca_{0.97}Eu_{0.03}Sb_2O_6$ | Whitish yellow | 585-625 | >140 + 10 | |

Calcium pyroantimonate $Ca_2Sb_2O_7$ is synthesized under the same conditions as described above, except that the amount of calcium carbonate in the above reaction formula is doubled.

Calcium fluoroantimonate $Ca_2Sb_2O_6F_2$ is synthesized in the same manner as described above, except that the first calcination is carried out at 975° C. and the second calcination is carried out at 1175° C. A simplified reaction formula is as follows:

$$2Sb_2O_4 + 3CaCO_3 + CaF_2 + \tfrac{1}{2}O_2 \rightarrow 2CaSb_2O_6F + 3CO_2$$

Thereafter, calcium metantimonate and calcium pyroantimonate are crystallized in a rhombic lattice, while calcium fluoroantimonate has a deformed pyrochlore structure which conforms to AIA (JECS 110 (1963) 1048.

The synthesized antimonate and fluoroantimonate exhibit a broadband light emission in a red spectrum region having a half-height width of about 100 to 150 nm and a maximum value of about 620 to 670 nm.

FIG. 1 shows an emission spectrum of a calcium fluoroantimonate phosphor. FIG. 2 shows reproduction of an emission spectrum of a calcium pyroantimonate phosphor.

Basically, a part of antimony can be replaced with other pentavalent elements, for example, V, Nb, Ta, P, As, and Bi without any problem, and, in this case, the reaction conditions may remain unchanged. These elements are added in the form Phosphor Containing Manganese(IV) as Activator:

Likewise, the red light emitting Mn(IV)-activated phosphor system is suitable for applications according to the invention in white LEDs and in a background illumination device, in a living space and lighting in furnishings, in photography and microscopic examination, in medical technology, and in lighting technology in museums and any place where a very authentic color rendering is important.

In addition to the antimonate as the matrix in which the preparation and formula have already been made, red light emitting Mn(IV)-activated phosphor systems comprising a titanate, a silicate-germanate, and an aluminate are also suitable for converting an ultraviolet or blue emitted light to a visible white radiation having a very high level of color rendering properties.

After all the manganese(IV)-activated phosphor are prepared, starting materials, for example, an oxide, a carbonate, and a halide and, in addition, manganese(IV) oxide are mixed, followed by calcination of the mixture in the air or oxygen at an elevated temperature above 1200° C. for a few hours. When the intermediates are fully homogenized and are then subjected to a secondary calcination process, the quality of the product is enhanced, and all the products have a color among colors ranging from yellowish white to yellowish green, that is, absorb a long-wavelength UV radiation or blue light. The products are then subjected to a further process, for example, grinding of the calcined cake, washing and sieving in the same manner as in the preparatin of the existing phosphors.

All the manganese(IV)-activated phosphors exhibit an emission band in a red spectrum region at about 620 to 700 nm, or exhibits a narrow structured light emission at about 650 to 660 nm.

Luminescence characteristics of manganese(IV)-activated antimonates using examples of several selected phosphors are shown in Table 2.

TABLE 2

| Phosphor | Solid color | Maximum emission, nm | Half-height width, nm |
|---|---|---|---|
| $CaSb_2O_6:0.01Mn$ | Yellow | 658 | 22 |
| $Mg_2Sb_2O_7:0.01Mn$ | Yellow | 653 | 25 |
| $Mg_{1.8}Li_{0.4}Sb_2O_6:0.01Mn$ | Yellow | 648 | 30 |
| $(Ca,Sr)Sb_2O_7:0.01Mn$ | Yellow | 655 | 25 |
| $Ca_2Sb_2O_6F:0.01Mn$ | Yellow | 657 | 21 |
| $Ca_2(Sb_{1.98}Si_{0.02})O_7:0.01Mn$ | Yellow | 656 | 23 |
| $(Ca,Sr)Sb_{1.98}Ge_{0.02}O_7:0.01Mn$ | Yellow | 658 | 22 |

Manganese(IV)-activated titanate phosphors are shown in Table 3. The emission values of the phosphors are obtained by applying complete oxidation calcination.

TABLE 3

Figure 5:
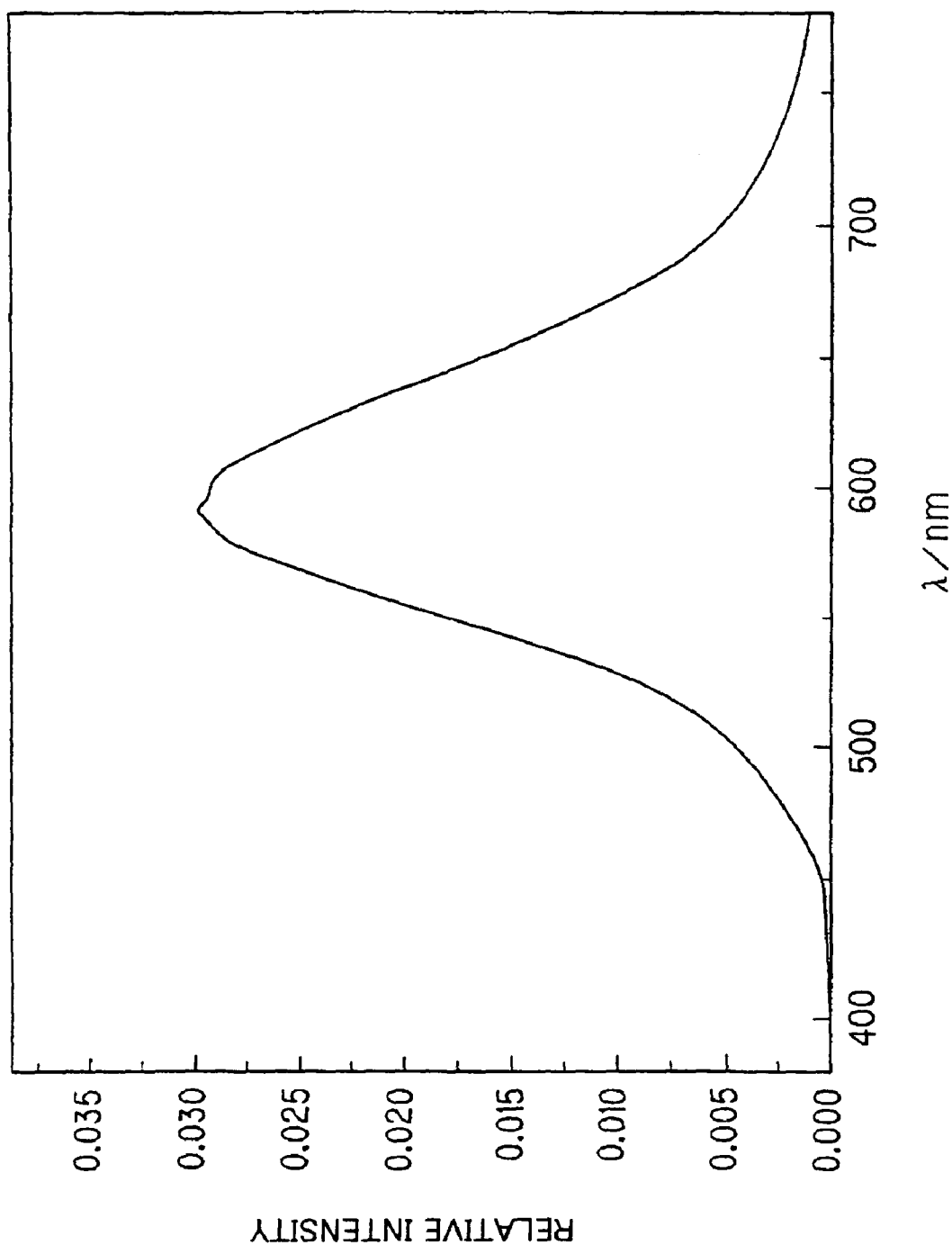
FIG. 5 is an emission spectrum of a $Ca_{0.6}Sr_{1.2}Ba_{0.1}Zn_{0.08}Si_{0.95}Ge_{0.05}O_4$:0.02Eu phosphor.
Figure 6:
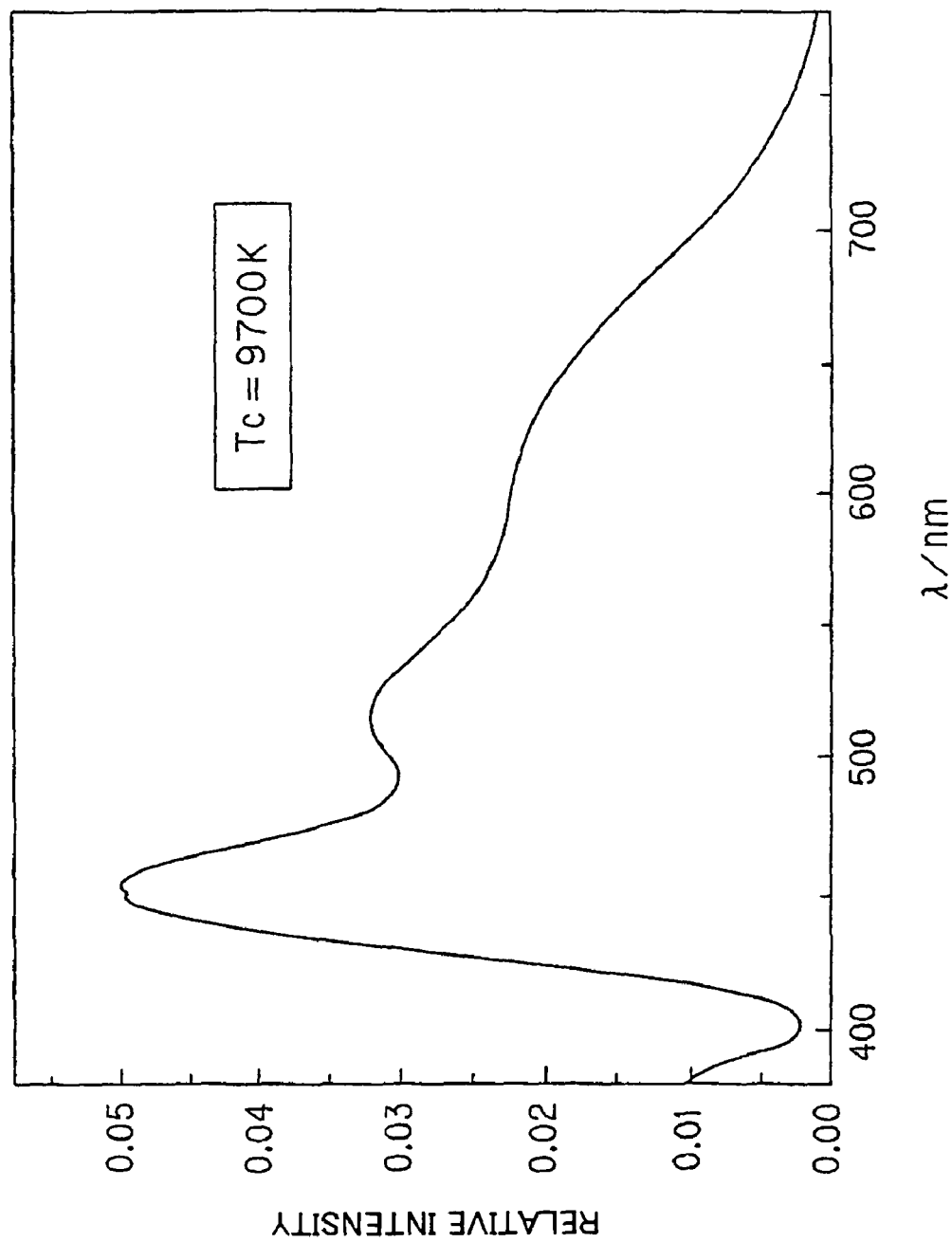
FIG. 6 is an emission spectrum (color temperature 9700 K, Ra=98) of a phosphor mixture in a combination with a UVA emission primary element.
Figure 7:
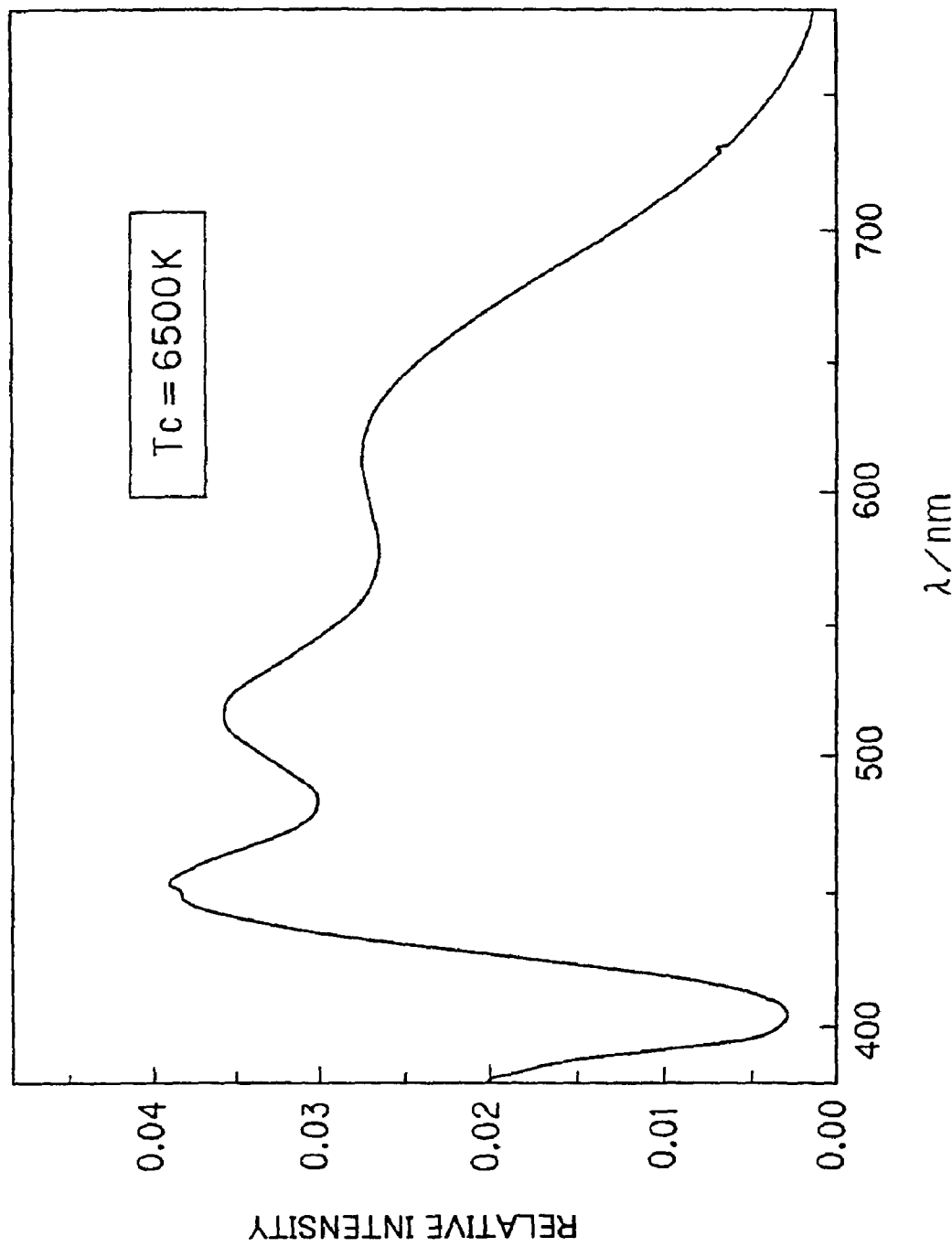
FIG. 7 is an emission spectrum (color temperature 6500 K, Ra=99) of a phosphor mixture in a combination with a UVA emission primary element.
Figure 8:
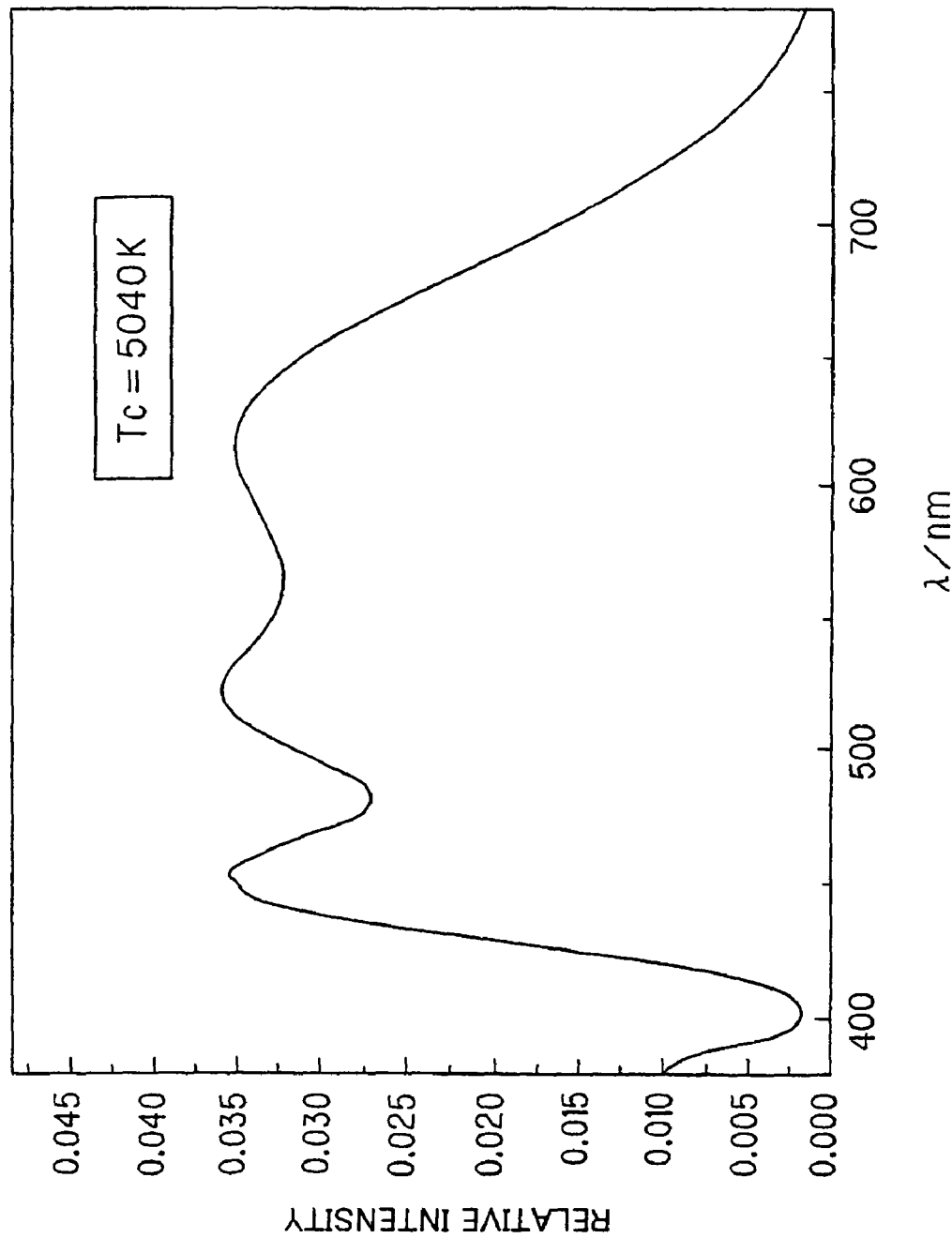
FIG. 8 is an emission spectrum (color temperature 5400 K, Ra=99) of a phosphor mixture in a combination with a UVA emission primary element.

| Phosphor | Solid color | Maximum emission, nm | Half-height width, nm | Remarks |
|---|---|---|---|---|
| $Mg_2TiO_4:0.005Mn$ | Yellow | 658 | 28 | FIG. 5 |
| $MgZnTiO_4:0.005Mn$ | Ocher | 650 | 30 | |
| $Mg_{1.8}Li_{0.4}TiO_4:0.005Mn$ | Ocher | 648 | 35 | |
| $MgBeTiO_4:0.005Mn$ | Yellow | 656 | 28 | |
| $CaMgTiO_4:0.005Mn$ | Yellow | 657 | 23 | |
| $Sr_{1.8}Li_{0.2}TiO_4:0.005Mn$ | Yellow | 656 | 24 | |
| $Mg_2Ti_{1.98}Zr_{0.02}O_4:0.005Mn$ | Yellow | 657 | 23 | |
| $MgZnTi_{0.98}Si_{0.02}O_4:0.005Mn$ | Yellow | 658 | 25 | |

In the case of incomplete oxidation, a different or additional emission band is provided in phosphors which have been shifted toward a shorter wavelength. They can be likewise used in the production of the white light emitting component.

The manganese(IV)-activated silicate-germanate phosphor and characteristics thereof are shown in Table 4.

TABLE 4

| Phosphor | Solid color | Maximum emission, nm | Half-height width, nm |
|---|---|---|---|
| $Ca_2Si_{0.9}Ge_{0.1}O_4:0.005Mn$ | Yellowish color | 658 | 23 |
| $Mg_2Si_{0.5}Ge_{0.5}O_4:0.005Mn$ | Yellow | 655 | 28 |
| $CaSrSi_{0.1}Ge_{0.9}O_4:0.003Mn$ | Yellow | 657 | 26 |
| $MgZnSiO_4:0.003Mn$ | Yellow | 659 | 25 |
| $MgSiO_3:0.005Mn$ | Whitish yellow | 660 | 23 |
| $CaMgSi_{0.95}Ge_{0.05}O_4:0.003Mn$ | Yellow | 658 | 26 |
| $Mg_{28}Ge_{9.45}Si_{0.55}O_{48}:0.005Mn$ | Yellowish color | 658 | 25 |
| $Mg_{28}Ge_9SiO_{48}:0.005Mn$ | Yellowish color | 659 | 26 |
| $Mg_{28}Ge_{7.2}Si_{0.3}O_{38}F_{10}:0.003Mn$ | Yellowish color | 660 | 26 |
| $Mg_{24}Zn_4Ge_{6.5}SiO_{38}F_{10}:0.005Mn$ | Yellowish color | 661 | 27 |

According to the invention, phosphors comprising silicate-germanates that exhibit broadband orange to orange-red emission bands may be prepared using calcium, and, in addition, a ternary compound containing a smaller cation in the case where activation with manganese is unnecessary and in the case where europium is incorporated as an activator instead of manganese. The use of these LEDs can realize a very high level of color rendering properties with a color rendering index Ra>95.

Europium(II)-activated silicate-germanates are prepared using the corresponding metal oxides and carbonates according to the following reaction formula by allowing a solid reaction to proceed in a reducing atmosphere of $N_2/H_2=9:1$ at a temperature of 1200 to 1300° C. for 3 to 5 hr:

$$CaCO_3+SrCO_3+SiO_2+GeO_2+Eu_2O_3 \rightarrow (Ca,Sr,Ba,Eu,)_2(Si,Ge)O_4+2CO_2$$

Crude phosphors thus obtained are washed and sieved. The phosphors thus obtained have a rhombic structure.

Europium(II)-activated silicate-germanate phosphors and luminescence characteristics thereof are shown in Table 5.

TABLE 5

| Phosphor | Solid color | Maximum emission, nm | Half-height width, nm |
|---|---|---|---|
| $Ca_{0.6}Sr_{1.3}Ba_{0.06}Zn_{0.02}Si_{0.9}Ge_{0.1}O_4:0.02Eu$ | Yellow-orange | 592 | 122 |
| $Ca_{0.6}Sr_{1.2}Ba_{0.1}Zn_{0.08}Si_{0.95}Ge_{0.05}O_4:0.02Eu$ | Yellow-orange | 594 | 120 |
| $Ca_{0.61}Sr_{1.3}Ba_{0.04}Mg_{0.01}Zn_{0.01}Si_{0.97}Ge_{0.03}O_4:0.03Eu$ | Orange | 600 | 126 |
| $Ca_{0.8}Sr_{0.11}Ba_{0.05}Be_{0.01}Li_{0.1}Si_{0.99}Ge_{0.01}O_4:0.03Eu$ | Orange-red | 608 | 131 |
| $Ca_{1.0}Sr_{0.95}Zn_{0.02}Si_{0.95}Ge_{0.05}O_4:0.03Eu$ | Orange | 605 | 128 |
| $Ca_{0.9}Sr_{0.9}Ba_{0.08}Mg_{0.05}Zn_{0.05}Ge_{0.45}Si_{0.55}O_4:0.02Eu$ | Yellow | 589 | 118 |
| $Ca_{1.0}Sr_{0.7}Ba_{0.1}Mg_{0.07}Zn_{0.1}Ge_{0.7}Si_{0.3}O_4:0.03Eu$ | Orange-red | 607 | 138 |
| $Ca_{0.65}Sr_{1.28}Ba_{0.02}Li_{0.04}Ge_{0.8}Si_{0.2}O_4:0.03Eu$ | Orange | 601 | 125 |
| $Ca_{1.2}Sr_{0.7}Ba_{0.03}Be_{0.05}Ge_{0.05}Si_{0.99}O_4:0.02Eu$ | Yellow-orange | 598 | 138 |

Manganese(IV)-Activated Aluminate Phosphors:

So far as the aluminates have a magnetoplumbite structure or other hexagonal structure, there is a possibility that a red or orange emission system can be efficiently provided from a simple spinel. In the case of incomplete oxidation, likewise, phosphors usable as a radiation converting agent in LEDs in the case where light emission takes place at a shorter wavelength are formed.

Several manganese(IV)-activated aluminate phosphors and luminescence characteristics thereof are shown in Table 6.

trum region. The following compounds which have not hitherto been used in LEDs were synthesized according to the invention. According to the invention, all of these compounds may also be used as a blue to green component depending upon the composition selected.

Phosphors comprising europium- and manganese-activated borate-silicate-phosphate and luminescence characteristics thereof are shown in Table 7.

TABLE 6

| Phosphor | Solid color | Maximum emission, nm | Half-height width, nm | Remarks |
|---|---|---|---|---|
| $MgAl_2O_4$:0.01Mn | Pink | 670 | 20 | Spinel structure |
| $CaAl_{12}O_{19}$:0.01Mn | Pink | 660 | 28 | $\beta$-$Al_2O_3$ structure |
| $SrAl_{12}O_{19}$:0.01Mn | Yellowish white | 659 | 27 | $\beta$-$Al_2O_3$ structure |
| $MgAl_{12}O_{19}$:0.01Mn | Rose | 678 | 20 | $\beta$-$Al_2O_3$ structure |
| $BeAl_{12}O_{19}$:0.01Mn | White-yellow | 679 | 21 | $\beta$-$Al_2O_3$ structure |
| $SrAl_2O_4$:0.01Mn | Yellowish color | 665 | 22 | Spinel structure |
| $Sr_{0.5}Mg_{0.5}Al_2O_4$:0.01Mn | Yellowish color | 660 | 23 | Spinel structure |
| $Sr_4Al_{14}O_{25}$:0.01Mn | Yellowish color | 657 | 21 | |
| $Mg_2Al_{10}O_{17}$:0.01Mn | Yellowish white | 658 | 23 | Hexahedron |
| $SrMgAl_{10}O_{17}$:0.01Mn | Yellowish white | 660 | 24 | Hexahedron |
| $Sr_2MgAl_{16}O_{27}$:0.01Mn | Yellowish white | 658 | 22 | Hexahedron |
| $2SrO.3Al_2O_3$:0.01Mn | Yellowish white | 660 | 21 | Cube |
| $BaO.4Al_2O_3$:0.01Mn | Yellowish white | 665 | 23 | Orthorhombic system |
| $MgGa_2O_4$:0.01Mn | Yellowish white | 670 | 23 | Spinel structure |

TABLE 7

| Phosphor | Solid color | Maximum emission, nm | Half-height width, nm | Remarks |
|---|---|---|---|---|
| $SrBaP_2O_7$:Eu, Mn | Whitish color | 425, 530 | 30, 60 | |
| $Sr_2P_{1.68}B_{0.32}O_{7.84}$:Eu, Mn | Yellowish color | 480, 520 | 85, 60 | |
| $Sr_4Si_3O_8Cl_4$:Eu, Mn | Yellowish green | 490, 540 | 70, 50 | |
| $Ba_3Mg(Si,P,Ge)_2O_8$:Eu, Mn | Yellowish white | 435, 670 | 90, 70 | |
| $(Sr,Ba)Al_2Si_2O_8$:Eu, Mn | White | 400, 620 | 25, 70 | |
| $Sr_{10}(PO_4)_6Cl_2$:Eu, Mn | Yellowish green | 447, 520 | 32, 40 | |
| $(Ba,Ca,Mg)_{10}(PO_4)_6Cl_2$:Eu, Mn | Yellowish green | 480, 580 | | Spodiosite structure |
| $Ca_3(PO_4)_2CaCl_2$:Eu, Mn | Yellowish green | 465, 570 | 60, 40 | |
| $Ba_{1.3}Sr_{0.75}Ca_{0.75}Mg_{0.9}Zn_{0.1}Si_{1.9}Ge_{0.1}O_8$:Eu, Mn | White-yellow | 445, 670 | | |
| $Ba_{2.8}MgSi_{1.8}Ge_{0.2}O_8$:Eu, Mn | Yellowish color | 440, 625 | | |
| $Sr_2ZnSi_{1.6}Ge_{0.4}O_7$:Eu, Mn | | 445, 630 | | |
| $Ba_2Zn_{0.5}Mg_{0.5}Ge_{1.2}Si_{0.8}O_7$:Eu, Mn | | 505 and shoulder | | |
| $Ba_3MgSi_{0.5}Ge_{0.5}O_8$:Eu, Mn | | 450, 670 | | |
| $BaZrO_3$ | | 530 | | |
| $Ba_3P_2O_8$:Eu, Mn | | 415, 520 | | |
| $\alpha$-$Ca_2P_2O_7$:Eu, Mn | | 417, 510 | | |
| $Ba_5Ca_3Si_4O_{16}$:Eu, Mn | | 491 | | |
| $Ba_3SiO_5$:Eu | | 590 | | |

Europium-Manganese Double Activated Phosphors:

Light emission of manganese(II) ions, which produce a color among colors ranging from yellow to red as either a separate emission band or a shoulder in a long wavelength region of primary light emission, should be sensitized by a primary activator of which the emission band overlaps with at least one characteristic excitation band of manganese(II). That is, Eu emission should be in a blue to blue-green spec- Phosphor mixtures may be prepared from the phosphors according to the invention. According to these phosphor mixtures, white LED having a continuous spectrum in a visible light range can be produced by superimposing eight or less spectra in the range of 380 to 780 nm.

Thus, all types of lights ranging from daylight to warm white light having a color temperature of about 10000 to 2000 K and a color rendering index Ra=99 can be realized.

Emission spectra of several white LEDs using the phosphor mixtures according to the invention are shown in FIGS. 6 to 12.

(Effects of Phosphors According to the Invention)

(1) The use of the phosphor according to the invention in the production of a white light emitting element is based on specifying of mixing individual emission spectra of phosphors with primary spectra of conventional ultraviolet or blue light emitting elements while taking intrinsic absorption of individual components into consideration. In the case of use in the blue or UV light emitting element, the phosphor and mixture thereof according to the invention can provide white light that is novel in quality and has a spectrum close to natural light or incandescent lamp light with high efficiency. This white light emitting lighting element is preferably used in the case where importance is attached to color rendering Ia, as well as to color rendering properties close to those under natural light, an incandescent lamp light or a halogen lamp light.

(2) In LEDs or other primary light emitting elements, in order to convert ultraviolet and blue radiations to a visible white radiation having a high level of color rendering properties, according to the invention, a phosphor, which emits a broadband light in an orange-red or red spectrum region or light in a narrower band than a dark red spectrum region with more than 650 nm, is used. The phosphor mixture, which comprises eight or less orange and red phosphor components according to the invention and exhibits a broad emission continuous state in the color wavelength range of 380 to 780 nm, is also suitable for converting ultraviolet and blue radiations to a visible white radiation.

(3) Phosphors very suited in a broadband orange-red or red spectrum region or a dark red narrower spectrum region include a solid system of alkaline earth metal antimonate and systems derived therefrom, for example, fluoroantimonates which exhibit intrinsic photoemission or have been activated by manganese(IV) or titanium(IV).

(4) A system using a sensitizer selected from the group consisting of Eu(II), and Mn(II) as a secondary activator can open further possibilities.

Optical devices using the above phosphors will be explained in detail.

First Embodiment

Figure 13:
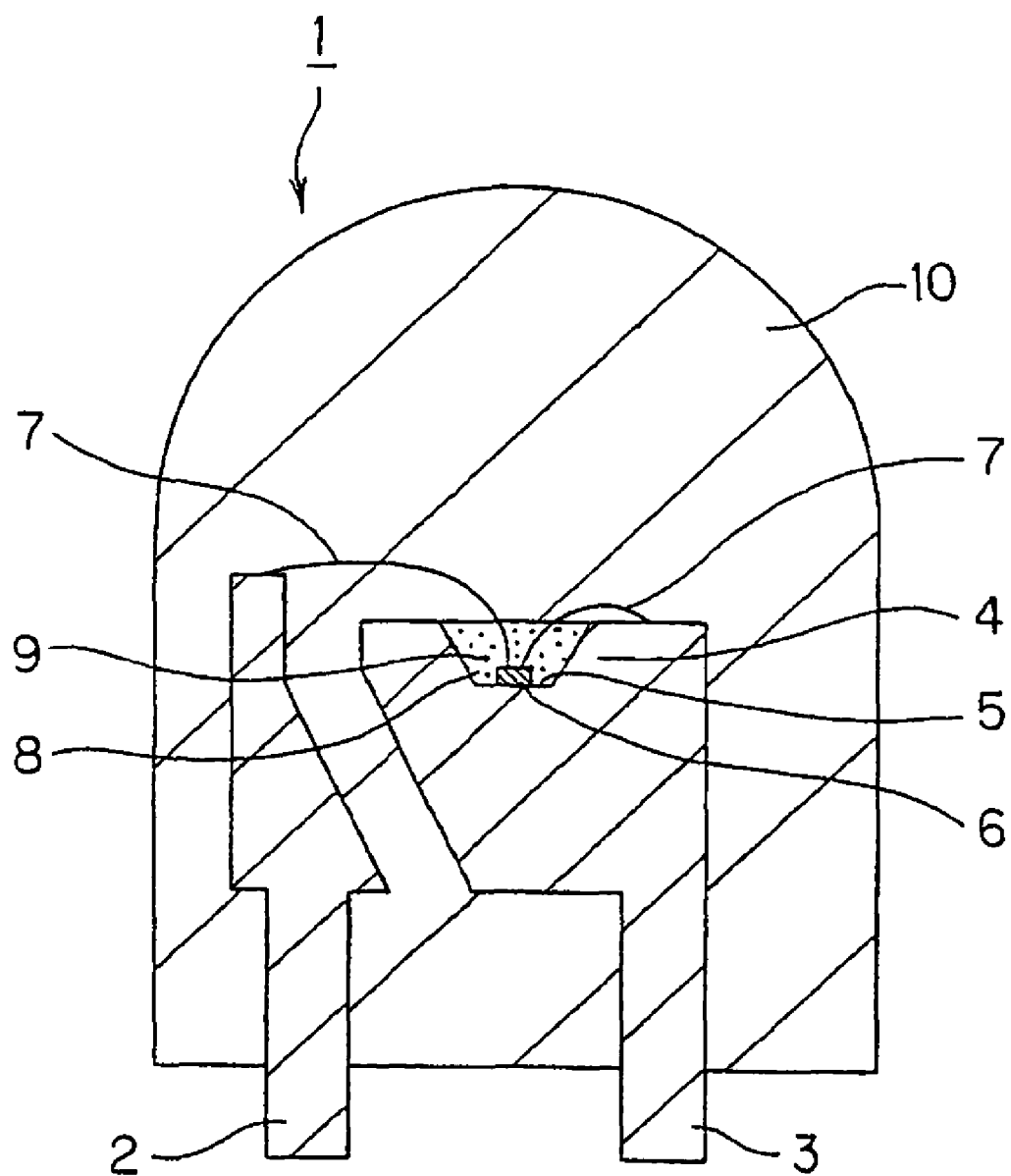
FIG. 13 is a cross-sectional view of a light emitting device in a first embodiment.

FIG. 13 is a cross-sectional view showing a light emitting device in the first embodiment of the invention.

This light emitting device 1 is a wavelength conversion-type light emitting device 1 comprising an LED element mounted on a lead. This device 1 includes leads 2 and 3 as wiring conductors. A cup part 4 for receiving an LED element is provided on the lead 2. An LED element 6 is bonded to the cup part 4 in its bottom part 5. The leads 2 and 3 are electrically connected to electrodes (not shown) of the LED element 6 through wires 7 of gold (Au). The cup part 4, together with the LED element 6 and the wire 7, is sealed with a light transparent sealing resin 8. A phosphor 9 is mixed in the sealing resin 8. The leads 2 and 3, the LED element 6, and the wires 7 are integrally sealed with a light transparent and shell-shaped sealing resin 10.

The leads 2 and 3 are formed of copper or a copper alloy having excellent thermal conductivity and electrical conductivity. The cup part 4 provided on the lead 3 has an inclined inner wall formed by enlarging the size of the inner wall toward the light emitting side from the viewpoint of enhancing light emission toward the outside of the cup.

The LED element 6 is a GaN based LED element that emits blue light with wavelength 460 nm. The LED element 6 is bonded and fixed onto the cup part 4 in its bottom part 5 with the aid of a light reflective adhesive.

The sealing resin 8 is a silicone resin mixed with the phosphor 9 and has been potted in the cup part 4 for sealing of the LED element 6.

The phosphor 9 is a phosphor comprising a light emitting component prepared from a solid system of an alkaline earth metal antimonate and a system derived from the solid system exhibiting intrinsic photoemission, such as a fluoroantimonate, a light emitting component prepared from a manganese(IV)-activated antimonate, a titanate, silicate-germanate, and an aluminate, a light emitting component prepared from a europium-activated silicate-germanate or from a system containing a sensitizer selected from a group consisting of Eu(II) and Mn(II) as a secondary activator and having an orange color, an orange-red color, a red color, or a dark red color in the spectrum range over 600 nm, or a light emitting component composed of a mixture of eight or less light emitting components having different emission bands and brought to a state of broad continuous emission of about 380 to 780 nm exhibiting a color temperature of about 10,000 K with blue-white color to 6,500 K with daylight color and a color temperature of about 3,000 K with warm white color to 2,000 K with twilight color of reddish yellow by virtue of the superposition of the light emitting bands.

Specifically, the sealing resin 8 is mixed with a phosphor 9 comprising a light emitting alkaline earth metal antimonate represented by general formula

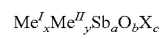

wherein $Me^I$ is at least one element selected from the group consisting of calcium (Ca), strontium (Sr), barium (Ba), cadmium (Cd), zinc (Zn), beryllium (Be), magnesium (Mg), europium (Eu), manganese (Mn), scandium (Sc), yttrium (Y), lanthanum (La), samarium (Sm), praseodymium (Pr), dysprosium (Dy), and terbium (Tb), $Me^{II}$ is at least one element selected from the group consisting of lithium (Li), sodium (Na), potassium (K), rubidium (Rb), and cesium (Cs), X (uppercase letter) represents at least one element selected from the group consisting of fluorine (F), chlorine (Cl), and bromine (Br), x (lowercase letter)=0 (zero) to 8, y=0 to 4, 0<a<16, 0<b<64, 0≦c≦4, and a part of antimony (Sb) may be replaced with vanadium (V), niobium (Nb), tantalum (Ta), phosphorus (P), arsenic (As), titanium (Ti), zirconium (Zr), hafnium (Hf), silicon (Si), germanium (Ge), molybdenum (Mo), or tungsten (W), or alternatively may contain a system derived from them, for example, a fluoroantimonate.

The sealing resin 10 is an epoxy resin and has a hemispherical optical shape on the light emission side formed by casting molding using a mold for forming a shell shape.

Figure 14:
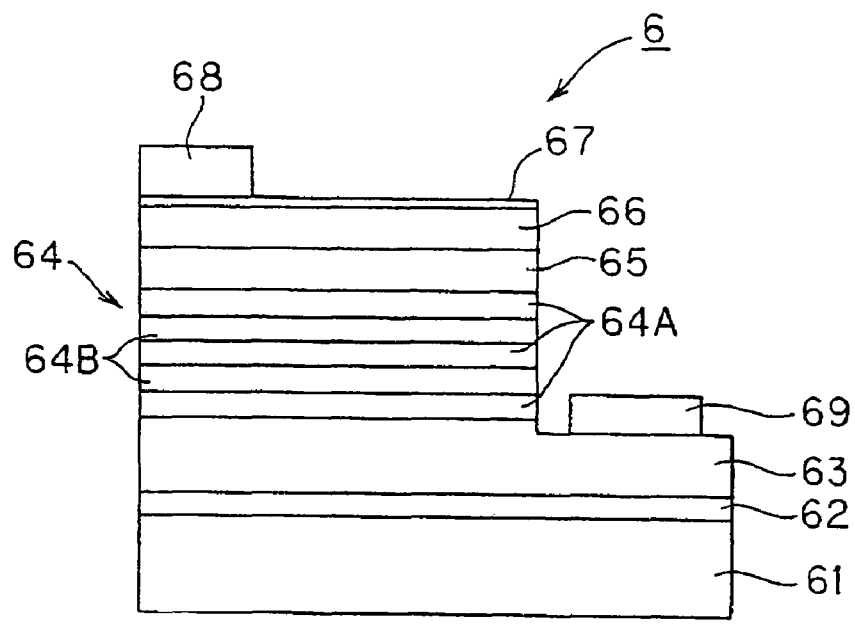
FIG. 14 is a diagram showing the layer construction of an LED element in a first embodiment.

FIG. 14 is a diagram showing the layer construction of the LED element 6. The LED element 6 includes a sapphire substrate 61. An AlN buffer layer 62 is provided on the sapphire substrate 61. An Si-doped n-type GaN cladding layer (a contact layer) 63 is provided on the AlN buffer layer 62. MQW 64 is provided on the n-type GaN cladding layer 63. MQW 64 comprises, provided on the n-type GaN cladding layer 63, three InGaN well layers 64A alternating with two GaN barrier layers 64B. An Mg-doped p-type GaN cladding layer 65 is provided on MQW 64. An Mg-doped p-type GaN contact layer 66 is provided on the p-type GaN cladding layer 65. A transparent electrode 67 is provided on the p-type GaN contact layer 66. A pad electrode 68 is provided on the transparent electrode 67 at its predetermined position, for example, a position near the side face of the element. The LED element 6 further includes an n-side electrode 69 which is formed by removing a part of the p-type GaN contact layer 66, the p-type GaN cladding layer 65, MQW 64, and the n-type GaN cladding layer 63 by etching to expose the n-type GaN cladding layer 63 and forming the n-side electrode 69 on the exposed n-type GaN cladding layer 63. This LED element 6 has a double heterostructure having MQW 64 as a luminescent layer, and Al may be properly incorporated in each layer.

Next, a process for manufacturing the light emitting device 1 will be explained.

At the outset, a copper plate for a lead frame is punched by pressing to form a lead frame with leads 2 and 3. The cup part 4 is formed on the lead 3 in the formation of the lead frame. The LED element 6 is then bonded and fixed onto a position within the cup part 4 with the aid of an adhesive. Next, the pad electrode 68 in the LED element 6 is electrically connected to the lead 2 through the wire 7, and the n-side electrode 69 is electrically connected to the lead 3 through the wire 7. A silicone resin previously mixed with the phosphor 9 is then potted in the cup part 4 to seal the LED element 6. The leads 2 and 3 with the sealed LED element 6 are then placed in a resin molding mold. An epoxy resin is then poured into the mold to form a shell-shaped sealing resin 10 around the leads 2 and 3. The leads 2 and 3 are then cut from the lead frame.

The operation of the light emitting device 1 will be explained.

The leads 2 and 3 are connected to a power supply unit (not shown). Upon energization, luminescence takes place in MQW 64 in the LED element 6. Light based on the luminescence in MQW 64 is emitted to the outside of the LED element 6, whereby the phosphor 9 is irradiated with this light. The phosphor 9 is excited by the light emitted from the LED element 6 (hereinafter referred to as "emitted light") to emit excitation light. The emitted light and the excitation light are mixed together to produce white light within the cup part 4. This white light is emitted from the inside of the cup part 4 to the outside of the light emitting device through the sealing resin 10. A part of the white light is reflected from the inclined inner wall in the cup part 4 and is then emitted to the outside of the light emitting device 1 through the sealing resin 10.

According to the light emitting device 1 in the first embodiment, the following effects can be attained.

Sealing of the cap part 4 with a sealing resin 8 mixed with the phosphor 9 capable of realizing a state of continuous emission of 380 to 780 nm with respect to light in an ultraviolet or blue light emitting region can realize a color rendering index Ra>90 and can enhance color rendering properties of white light.

The improvement in color rendering properties of white light can realize an authentic color rendering using LED as a light source and thus can render the light emitting device suitable for lighting in a living space, lighting in furnishings, photography and microscopic examination, lighting in medical fields, and lighting in museums and the like. Further, the light emitting device can be applied to lighting technology in any place where a very authentic color rendering is important.

In the first embodiment, a construction using a phosphor 9 comprising a light emitting alkaline earth metal antimonate has been explained. The phosphor 9 may be one mixed, as other phosphor 9, e.g., with a phosphor 9 comprising a light emitting component prepared from a fluoroantimonate, a light emitting component prepared from a manganese(IV)-activated antimonate, a titanate, silicate-germanate, and an aluminate, a light emitting component prepared from a europium-activated silicate-germanate or from a system containing a sensitizer selected from a group consisting of Eu(II) and Mn(II) as a secondary activator and having an orange color, an orange-red color, a red color, or a dark red color in the spectrum range over 600 nm.

In order to enhance light emission to the outside of the LED element 6, a light reflective layer may be provided on MQW 64 in its sapphire substrate 61 side. Specifically, an Al layer may be provided as the light reflective layer on the sapphire substrate 61.

Figure 15:
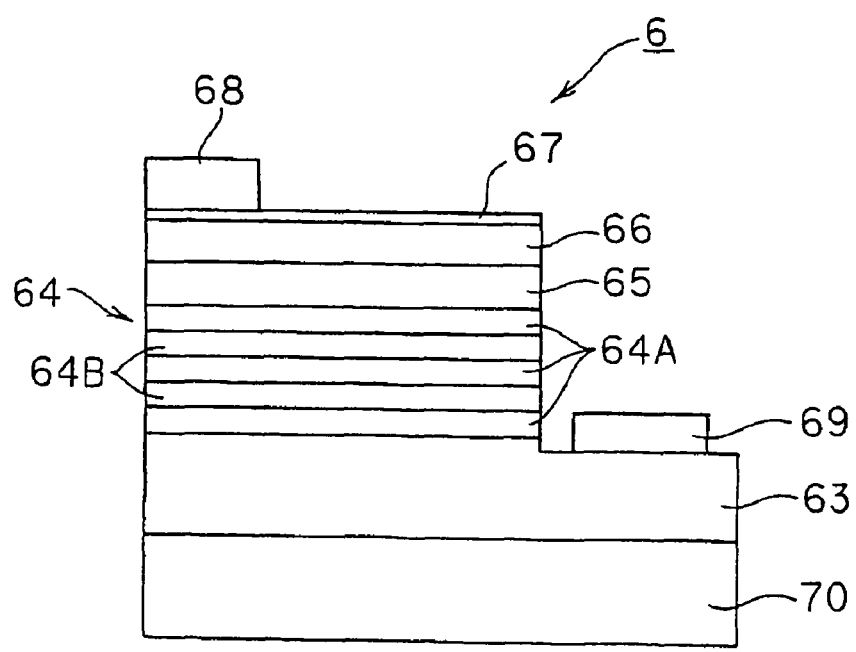
FIG. 15 is a diagram showing another layer construction of the LED element in the first embodiment.

FIG. 15 is a diagram showing another embodiment of the layer construction of the LED element 6. This LED element 6 is the same as the LED element 6 shown in FIG. 14, except that a GaN substrate 70 is used as the substrate and the provision of the AlN buffer layer is omitted. An LED element 6 formed by performing crystal growth of a GaN base semiconductor layer on the GaN substrate 70 may also be used. Further, an LED element 6 using a substrate formed of a material such as Si, SiC, or AlGaN may be used as a light source.

Second Embodiment

Figure 16A:
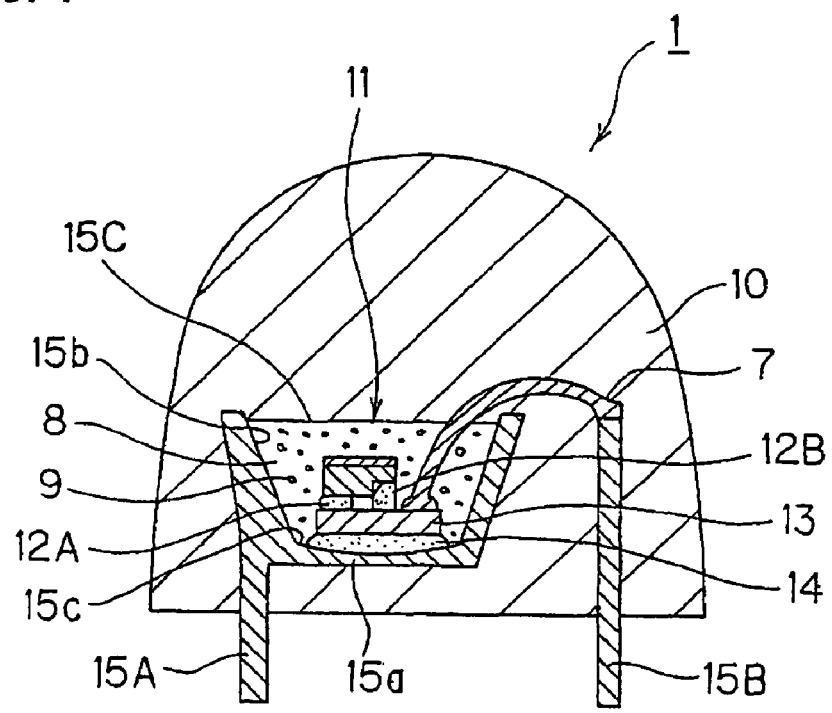
FIG. 16 is a diagram showing a light emitting device in a second embodiment, wherein (a) is a longitudinal sectional view and (b) is a partially enlarged view of an LED element.
Figure 16B:
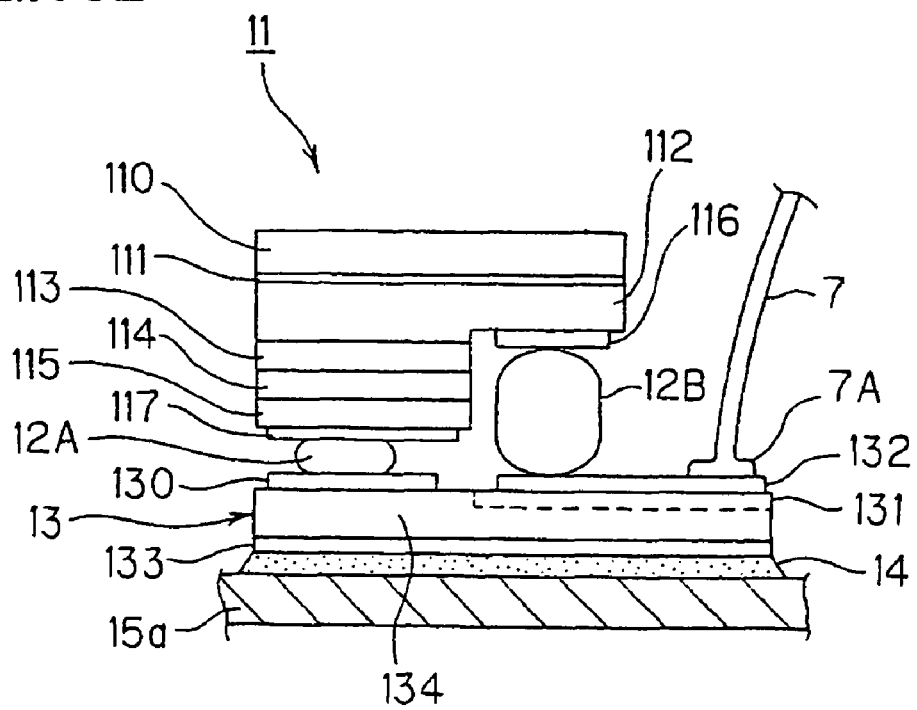

FIG. 16 shows a light emitting device in the second embodiment of the invention, wherein (a) is a longitudinal sectional view and (b) is a partially enlarged view of an LED element. Parts corresponding to the respective parts in the first embodiment are identified with the same reference numerals.

In this light emitting device 1, a flip chip-type LED element 11 is used as the light source. As shown in FIG. 16 (a), the light emitting device 1 includes an LED element 11. A submount part 13 formed of Si is electrically connected through Au bumps 12A and 12B to the LED element 11. An Ag paste 14 as an electrically conductive adhesive electrically connects the submount part 13 to a lead 15A in its cup part 15a. A lead 15B is electrically connected to the submount part 13 through a wire. An element receiving part 15C is provided in the lead 15A. An inclined light reflective surface 15b is provided within the element receiving part 15C.

As shown in FIG. 16 (b), the LED element 11 includes a light transparent sapphire substrate 110. On the substrate 110 are provided, in the following order, an AlN buffer layer 111, an n-type GaN cladding layer 112, MQW 113 comprising three InGaN well layers alternating with two GaN barrier layers, a p-type GaN cladding layer 114, and a p-type GaN contact layer 115. The LED element 11 further includes an n-side electrode 116 which is formed by removing a part of the p-type GaN contact layer 115, the p-type GaN cladding layer 114, MQW 113, and the n-type GaN cladding layer 112 by etching to expose the n-type GaN cladding layer 112 and forming the n-side electrode 116 on the exposed n-type GaN cladding layer 112. A p-side electrode 117 is provided on the p-type GaN contact layer 115. The LED element 11 is fixed to the submount part 13 so that the substrate side is disposed on the opening side of the cup part 15a.

As shown in FIG. 16 (b), the submount part 13 includes an n-type semiconductor layer 134. An n-side electrode 130 is provided on the surface of the n-type semiconductor layer 134. A p-type semiconductor layer 131 is provided on a part of the n-type semiconductor layer 134. A p-side electrode 132 is provided on the p-type semiconductor layer 131. An n-side electrode 133 is provided on the n-type semiconductor layer 134 in its bottom side, that is, in its side where the n-type semiconductor layer 134 is bonded to the cup part 15a. The n-side electrode 130 is connected to the p-side electrode 117 in the LED element 11 through the Au bump 12A. Further, the p-side electrode 132 is connected through the Au bump 12B to the n-side electrode 116 in the LED element 11, and the wire 7 is connected to the p-side electrode 132.

The sealing resin 8 has been mixed with the phosphor 9 explained in connection with the first embodiment and has been potted into the cup part 15a so as to cover the LED element 11 and the submount part 13 for sealing.

In fixing the LED element 11 to a position within the cup part 15a, an Ag paste 14 is first coated onto the cup part 15a in its bottom part 15c. The submount part 13 is then fixed to the position within the cup part 15a by the Ag paste 14. Next, the LED element 11 is mounted through the Au bumps 12A and 12B. The LED element 11 is bonded to the submount part 13 by ultrasonic bonding. The p-side electrode 132 is then electrically connected to the lead 15B through the wire. The sealing resin 8 is then potted in the cup part 15a to cover the LED element 11 and the submount part 13 for sealing.

The sealing resin 10 is molded into a shell shape to seal the lead 15A with the sealed cup part 15a and the lead 15B.

The light emitting device 1 in the second embodiment is advantageous in that, in addition to the favorable effects of the first embodiment, an additional effect, that is, the effect of improving light takeout efficiency, can be attained by virtue of the construction in which light based on luminescence in MQW 113 can be emitted from the sapphire substrate side. Further, the function of protection against static electricity can be imparted to the submount part 13. In this case, breaking of the LED element 11 by static electricity can be prevented.

Third Embodiment

Figure 17:
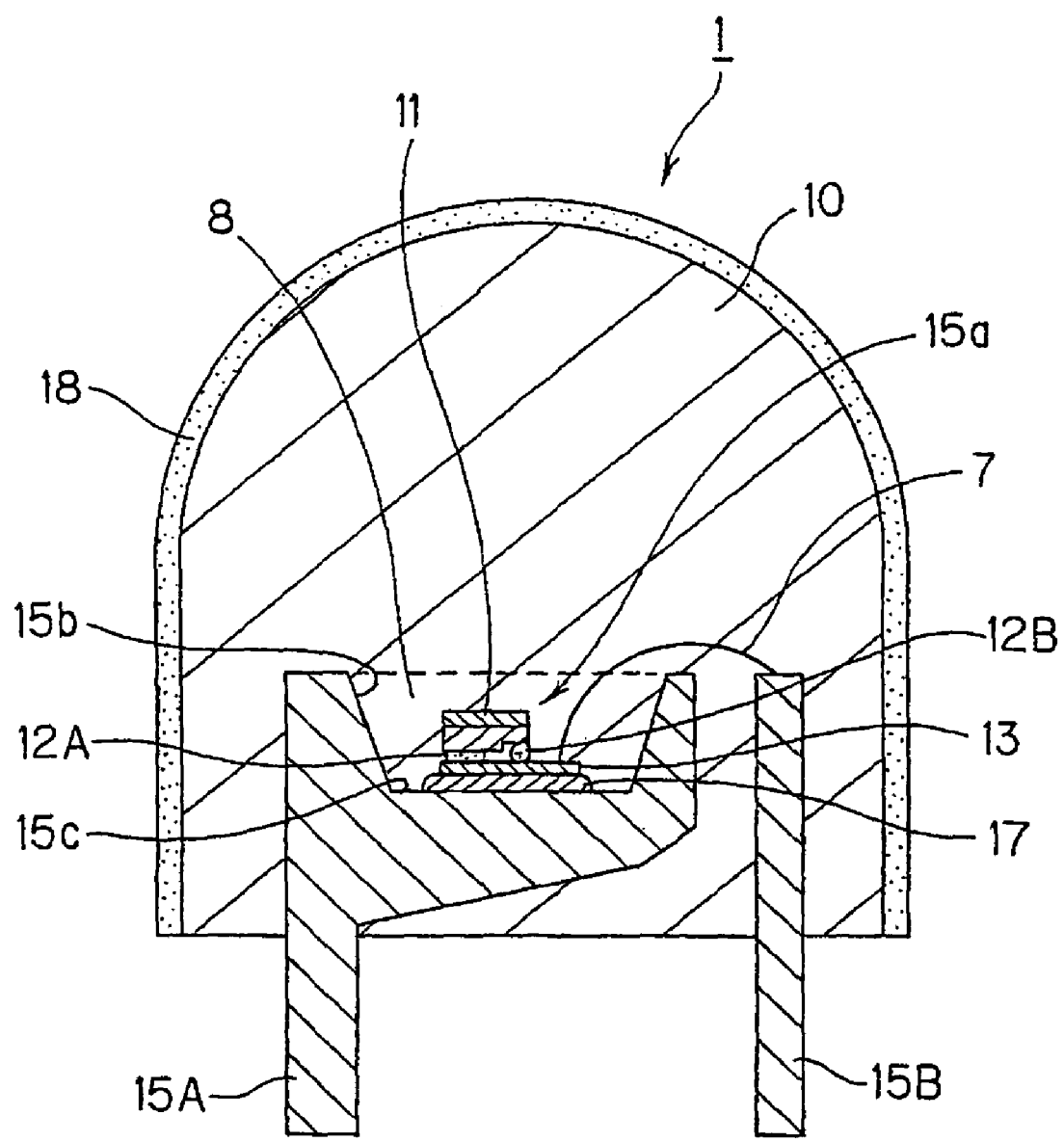
FIG. 17 is a cross-sectional view of a light emitting device in a third embodiment.

FIG. 17 is a cross-sectional view showing a light emitting device in the third embodiment of the invention.

The construction of this light emitting device 1 is such that a cap-shaped phosphor layer 18 formed of a resin material such as an epoxy resin containing the phosphor 9 explained above in connection with the first and second embodiments is provided on the surface of the shell-shaped sealing resin 10, and the phosphor 9 has been omitted from the sealing resin 8 for sealing the cup part 15a.

The light emitting device 1 in the third embodiment is advantageous in that, in addition to the favorable effects of the first and second embodiments, an additional effect can be attained. Specifically, since the phosphor 9 is not deposited around the LED element 11, a lowering in efficiency of emission to the outside of the light emitting device caused by the absorption of light in the deposited phosphor can be prevented. By virtue of this effect, light efficiently led to the surface of the sealing resin 10 can be subjected to wavelength conversion in the phosphor layer 18, followed by emission to the outside to the light emitting device. Thus, a high-brightness wavelength conversion-type light emitting device 1 can be provided.

Fourth Embodiment

Figure 9:
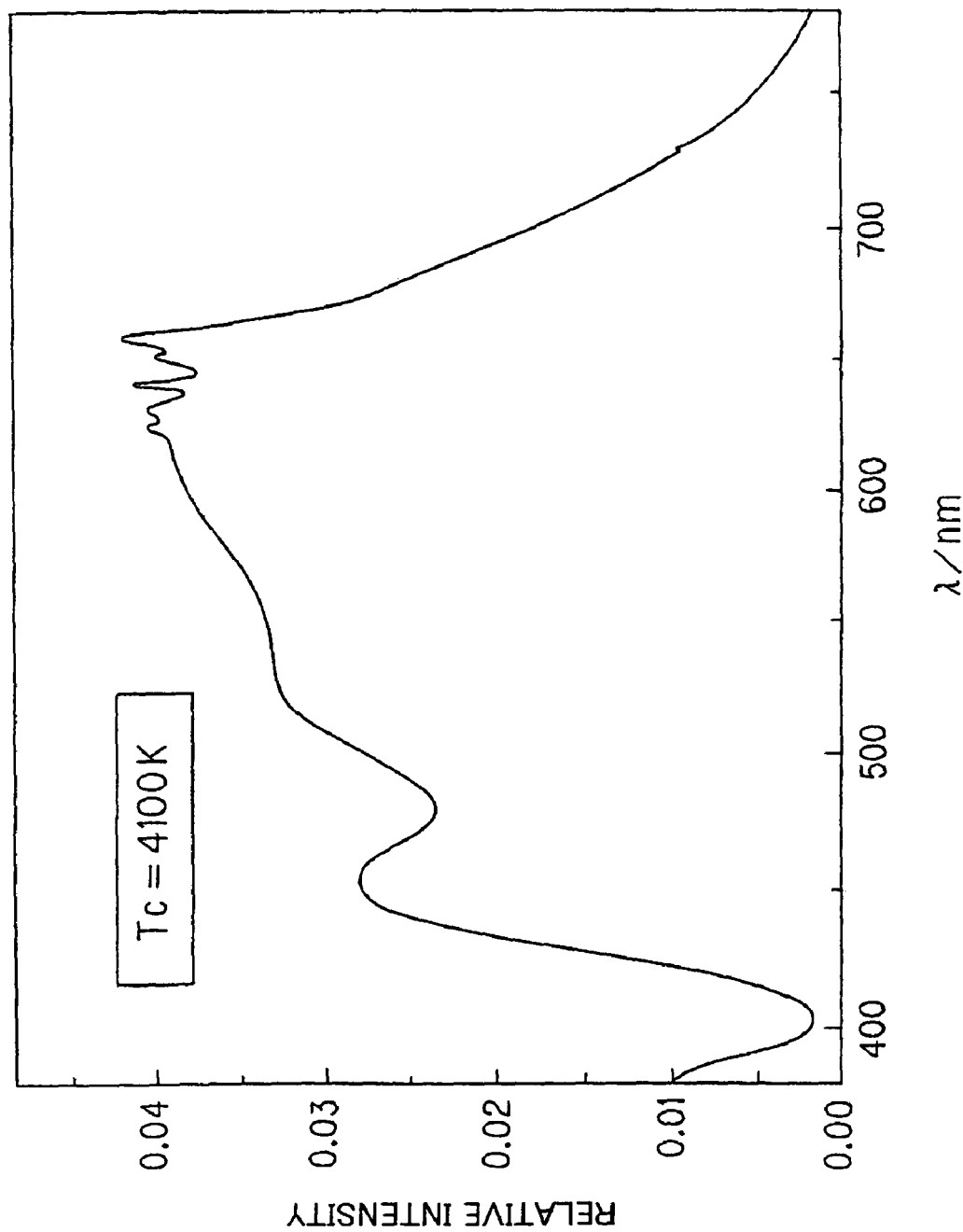
FIG. 9 is an emission spectrum (color temperature 4100 K, Ra=99) of a phosphor mixture in a combination with a UVA emission primary element.
Figure 10:
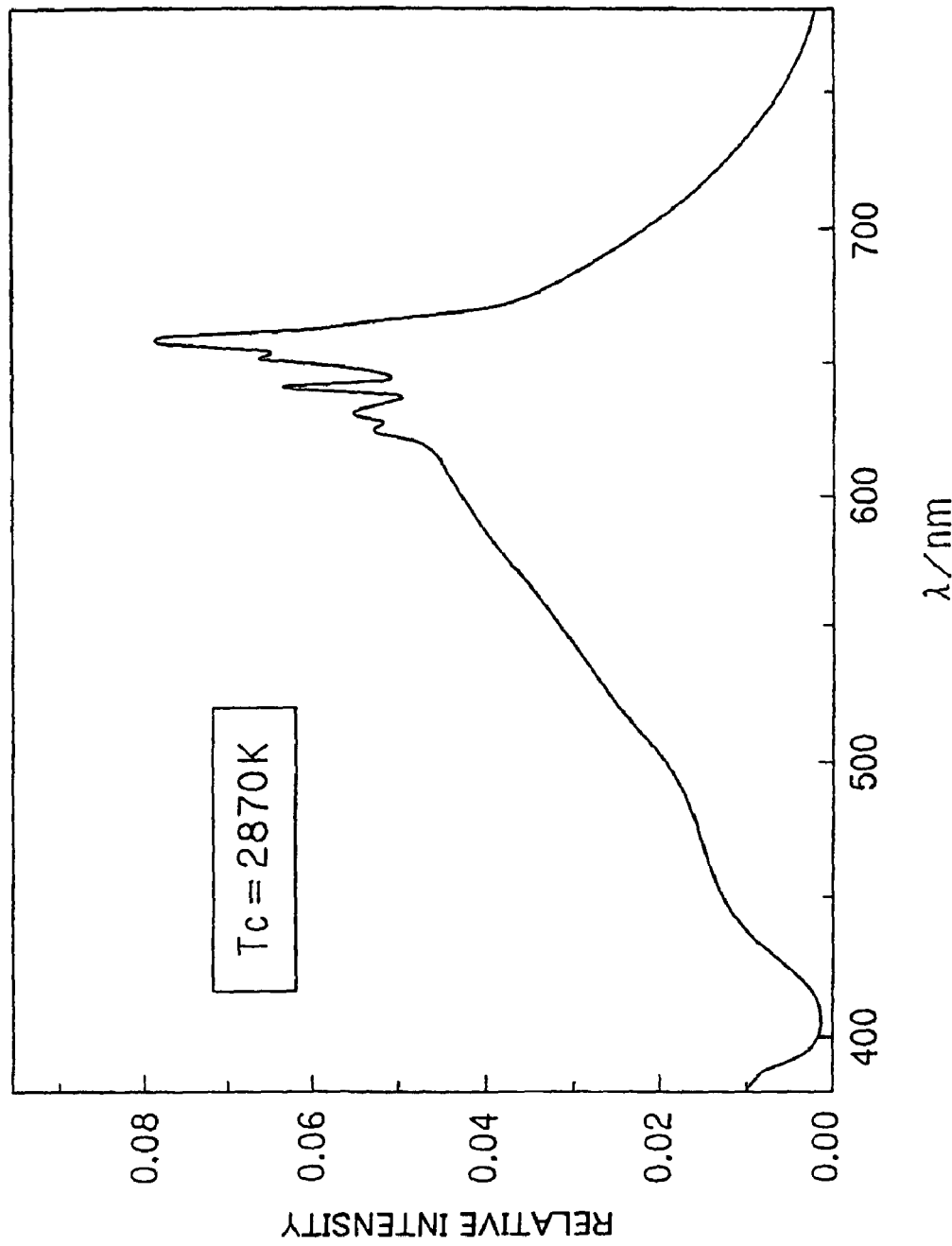
FIG. 10 is an emission spectrum (color temperature 2870 K, Ra=99) of a phosphor mixture in a combination with a UVA emission primary element.
Figure 11:
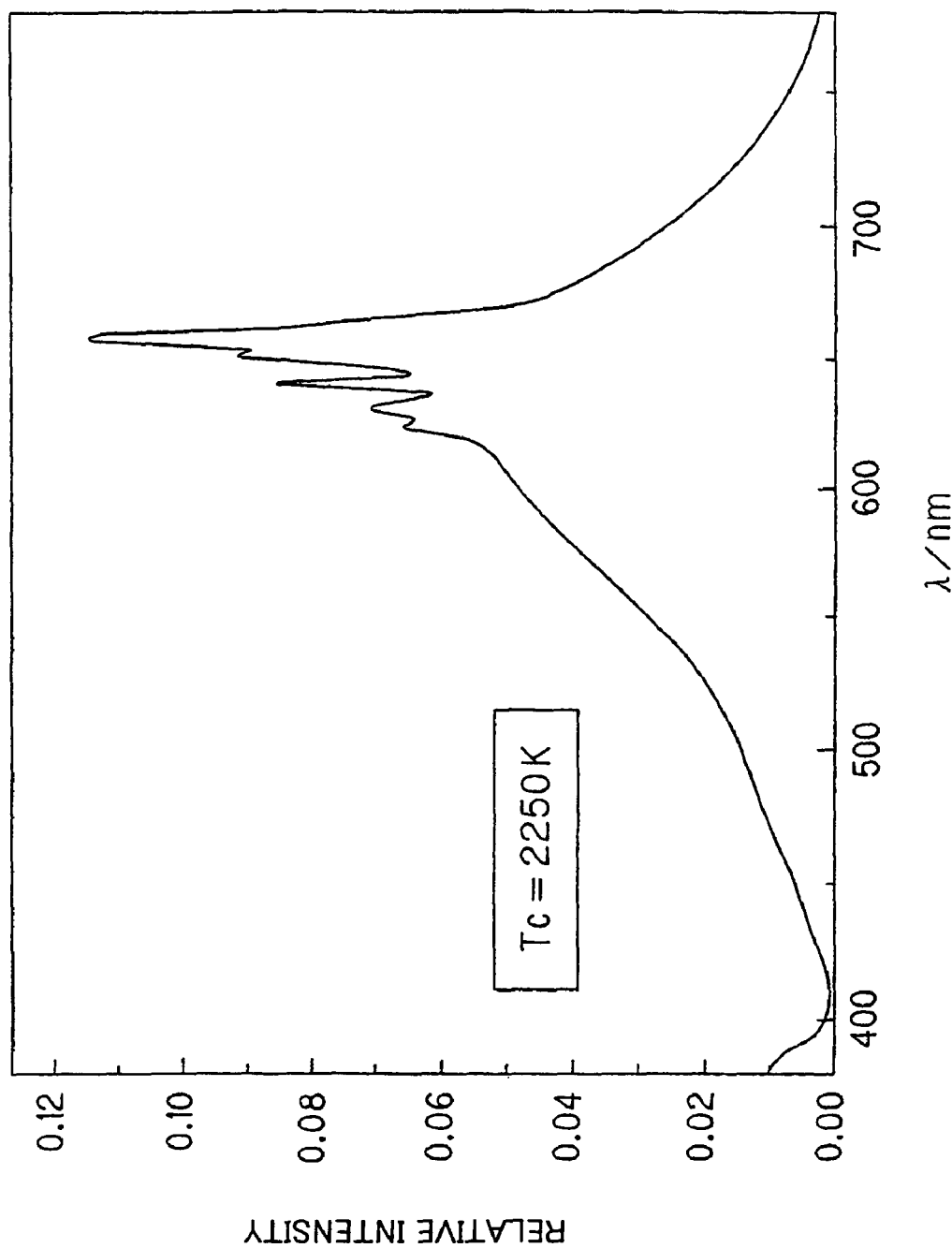
FIG. 11 is an emission spectrum (color temperature 2250 K, Ra=99) of a phosphor mixture in a combination with a UVA emission primary element.
Figure 12:
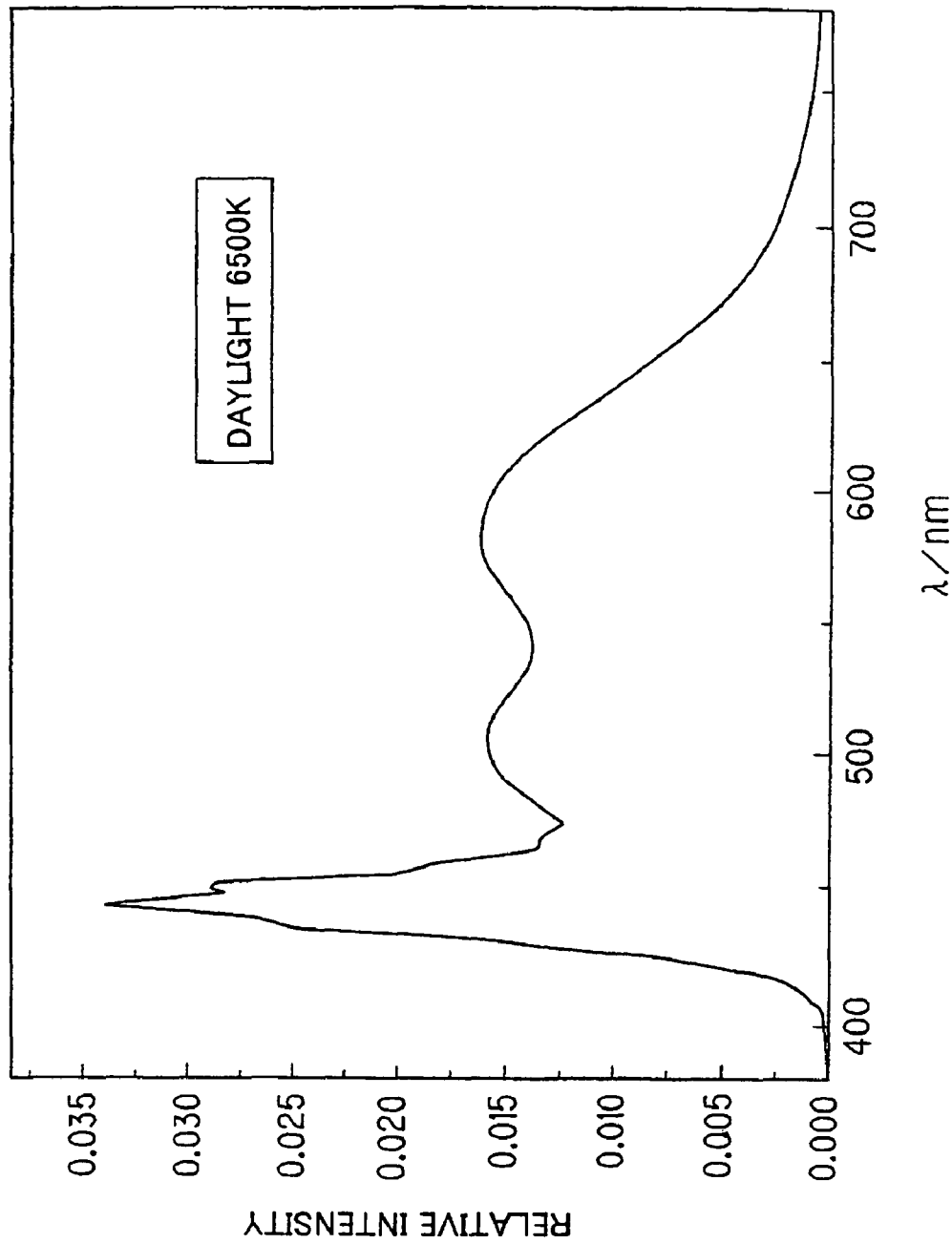
FIG. 12 is an emission spectrum of white light emitting LED comprising a combination of blue light emitting LED with the phosphor mixture according to the invention having a color temperature 6500 K and Ra=95.
Figure 18:
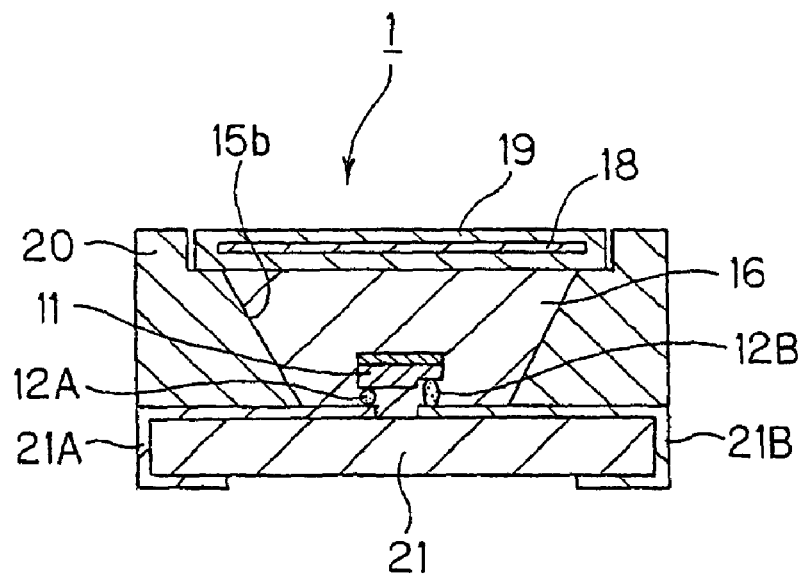
FIG. 18 is a cross-sectional view of a light emitting device in a fourth embodiment.

FIG. 18 is a cross-sectional view showing a light emitting device in the fourth embodiment of the invention. In FIG. 9, parts corresponding to the respective parts in the first to third embodiments are identified with the same reference numerals.

This light emitting device 1 is a surface mounting-type wavelength conversion-type light emitting device 1. The light emitting device 1 includes an LED element 11, a wavelength converting part 19 including a phosphor layer 18 excitable based on light emitted from the LED element 11, a body 20 formed of a resin material such as an acrylic resin, and a ceramic substrate 21 for mounting thereon the LED element 11.

Wavelength converting part 19 is formed by interposing a phosphor layer 18 formed of the phosphor 9 explained above in connection with the first to third embodiments between two glass sheets formed of low melting glass and heating the assembly for integration. Specifically, the phosphor 9 is screen printed on one side of the first glass sheet, and the printed first glass sheet is heat treated at 150° C. to remove the binder component to form a thinned film. The second glass sheet is disposed so that the thinned phosphor layer 18 is interposed between the first and second glass sheets, followed by heat treatment to integrate the first and second glass sheets.

The body 20 has a light reflective surface 15b in its inner part. The light reflective surface 15b reflects light emitted from the LED element 11 toward the wavelength converting part 19. The light emitting surface and the surface of the wavelength converting part 19 constitute an identical plane. A space surrounded by the light reflective surface 15b is filled with a silicone resin 16.

The ceramic substrate 21 has on its surface wiring layers 21A and 21B in a copper foil pattern for joining the LED element 11 to the ceramic substrate 21 through the Au bumps 12A and 12B. The wiring layers 21A and 21B are provided through the side face of the ceramic substrate 21 toward the backside, of the ceramic substrate 21, which is a surface for joining to an external circuit.

The light emitting device 1 in the fourth embodiment of the invention is advantageous in that, in addition to the favorable effects of the first to third embodiments, an additional effect can be attained. Specifically, since the thin-film phosphor layer 18 formed of the phosphor 9 is sealed with glass, the water resistance and moisture absorption resistance of the phosphor layer 18 can be improved. Thus, a light emitting device 1 which exhibits good wavelength conversion for a long period of time can be provided.

Further, the phosphor layer 18 is formed in a thin film form based on screen printing and heat treatment. Therefore, light absorption loss caused by the phosphor layer 18 can be reduced, and, thus, a high-brightness wavelength conversion-type light emitting device 1 can be realized.

Furthermore, by virtue of a thickness reduction in the phosphor layer 18, the amount of the phosphor 9 used can be reduced. Therefore, a cost reduction in the light emitting device 1 can be realized.

Fifth Embodiment

Figure 19:
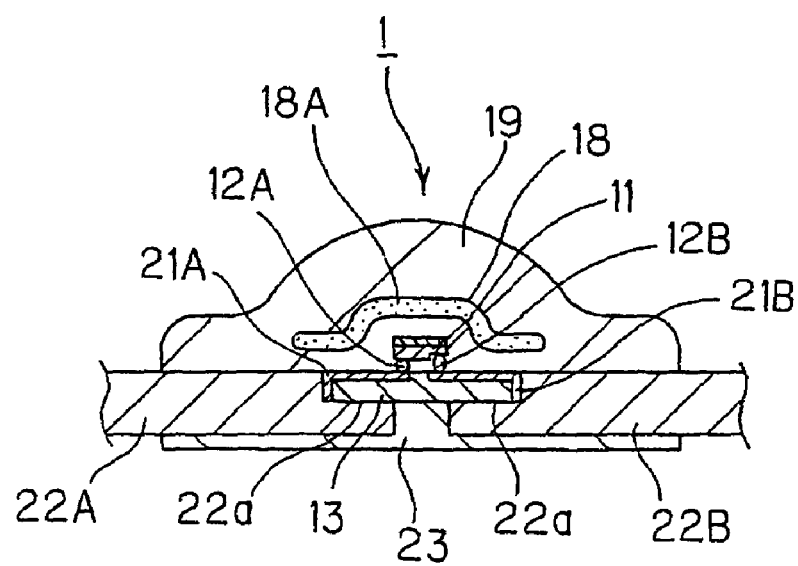
FIG. 19 is a cross-sectional view of a light emitting device in a fifth embodiment.

FIG. 19 is a cross-sectional view showing a light emitting device in the fifth embodiment of the invention. In FIG. 19, parts corresponding to the respective parts in the first to fourth embodiments are identified with the same reference numerals.

This light emitting device 1 includes a flip chip-type (0.3× 0.3 mm) LED element 11. The LED element 11 is mounted on a submount part 13 of AlN. Lead frames 22A and 22B are joined to the submount part 13. A wavelength converting part 19 formed of low melting glass is provided for sealing the LED element 11 and the submount part 13 and for performing wavelength conversion of light emitted from the LED element 11. The submount part 13 and the lead frames 22A and 22B, together with the wavelength converting part 19, are integrally sealed by a glass sealing part 23 formed of low melting glass. The wavelength converting part 19 has an optical shape which can regulate the distribution of light emitted from the LED element 11, that is, is formed in a dome form, and, further, comprises a phosphor layer 18 disposed apart by a predetermined distance from the LED element 11.

Wiring layers 21A and 21B formed of a copper foil are provided on the surface of the submount part 13. The wiring layers 21A and 21B are electrically connected to the lead frames 22A and 22B by fitting into stepped parts 22a and 22b provided in the lead frames 22A and 22B.

In the wavelength converting part 19, the optical shape is formed by interposing the phosphor layer 18 between the first and second glass sheets explained above in connection with the fourth embodiment and hot pressing the assembly. Further, the lead frames 22A and 22B are integrally sealed by heat treatment of a third glass sheet for constituting the glass sealing part 23 simultaneously with the hot pressing. The phosphor layer 18 is disposed while providing a spacing, corresponding to the thickness of the glass sheet upon deformation based on the heat treatment of the glass, between the phosphor layer 18 and the LED element 11.

The light emitting device 1 in the fifth embodiment of the invention is advantageous in that, in addition to the favorable effects of the first to fourth embodiments, an additional effect can be attained. Specifically, since the wavelength converting part 19 has an optical shape, light produced by mixing light emitted from the LED element 11 with light subjected to wavelength conversion in the phosphor layer 18 can be emitted to a desired area.

Further, sealing of the LED element 11 with glass can improve water resistance and moisture absorption resistance. Thus, a high-brightness wavelength conversion-type light emitting device 1, which is stable even under severe environmental conditions such as high-humidity conditions for a long period, can be realized.

Sixth Embodiment

Figure 20:
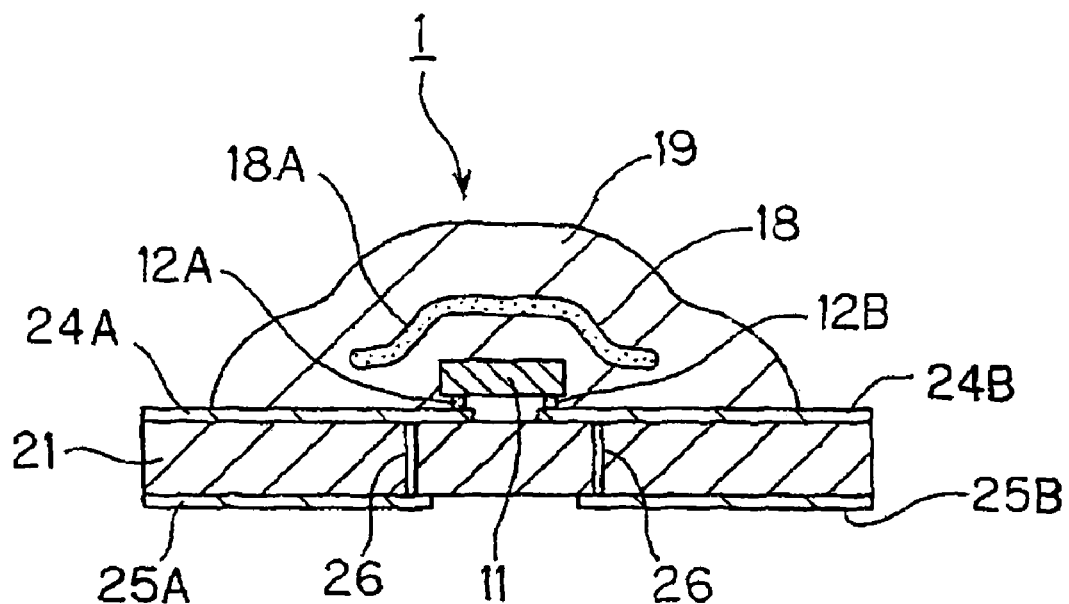
FIG. 20 is a cross-sectional view of a light emitting device in a sixth embodiment.

FIG. 20 is a cross-sectional view showing a light emitting device in the sixth embodiment of the invention. In FIG. 20, parts corresponding to the respective parts in the first to fifth embodiments are identified with the same reference numerals.

In this light emitting device 1, instead of the lead frames 22A and 22B in the fifth embodiment, a ceramic substrate 21 having on its both sides wiring layers 24A, 24B, 25A, and 25B formed of a copper foil is used, and the wiring layer 24A is electrically connected to the wiring layer 25A through a through-hole 26 while the wiring layer 24B is electrically connected to the wiring layer 25B through a through-hole 26. A flip chip-type (1×1 mm) LED element 11 is electrically connected to the wiring layers 24A, 24B respectively through Au bumps 12A and 12B.

The wiring layers 24A and 24B are formed so as to have a larger area than the area of bonding of the glass material constituting the wavelength converting part 19.

The light emitting device 1 in the sixth embodiment of the invention is advantageous in that, in addition to the favorable effects of the first to fifth embodiments, an additional effect can be attained. Specifically, since the wavelength converting part 19 is bonded to the wiring layers 24A and 24B formed of a copper foil provided on the surface of the ceramic substrate 21, excellent adhesion between the wavelength converting part 19 and the wiring layers 24A and 24B can be achieved based on good adhesion between the glass material and the copper foil. By virtue of this, separation of the wavelength converting part 19 and absorption of moisture in the interior of the light emitting device 1 can be firmly prevented. Thus, a highly reliable wavelength conversion-type light emitting device 1 can be realized.

Further, since the ceramic substrate 21 is used, a group of light emitting devices which have been formed together on a substrate material as a base can easily be taken off by cutting such as dicing or scribing. Thus, a wavelength conversion-type light emitting device 1 can be manufactured with high productivity.

Seventh Embodiment

Figure 21:
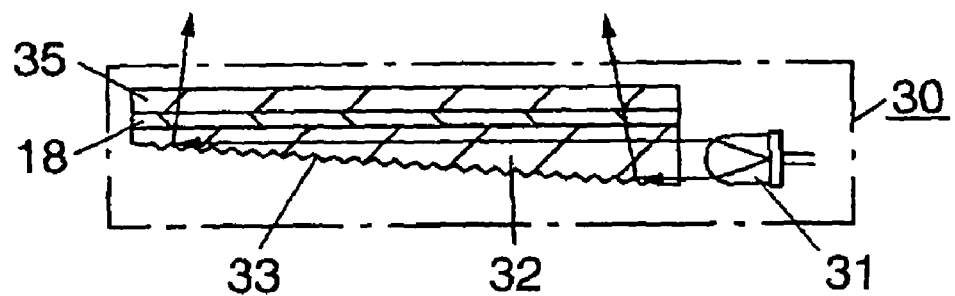
FIG. 21 is a cross-sectional view of a liquid crystal backlight device as an optical device in a seventh embodiment.

FIG. 21 is a cross-sectional view showing a liquid crystal backlight device as an optical device in the seventh embodiment of the invention. In FIG. 21, parts corresponding to the respective parts in the first to sixth embodiments are identified with the same reference numerals.

This liquid crystal backlight device 30 includes an LED lamp 31 as a light source, and a light guide body 32 for guiding light emitted from the LED lamp. A phosphor layer 18 for performing wavelength conversion of light emitted from the LED lamp 31 is provided on a surface of the light guide body 32. A liquid crystal panel 35 is provided for permitting transmitted illumination from the back surface based on the wavelength converted light.

The LED lamp 31 functions to collect, in a shell-shaped resin sealing part, blue light with wavelength 460 nm based on luminescence in an LED element comprising a GaN based semiconductor layer and to emit the collected light to a predetermined radiation area.

The light guide body 32 has a reflecting surface 32A for reflecting light supplied from the LED lamp 31 in a right-angle direction, a bottom surface 32B, and an inclined surface 32C to which the light, which has been reflected from the reflecting surface 32A and guided through the light guide body 32, is incident. A light reflective layer 33 is provided on the bottom surface 32B. Further, a phosphor layer 18 formed of a phosphor comprising a light emitting alkaline earth metal antimonate capable of realizing a state of continuous emission of 380 to 780 nm with respect to light in an ultraviolet or blue light emitting region is provided as a thin film in the inclined surface 32C.

The liquid crystal panel 35 comprises, for example, a TFT (thin film transistor) substrate, a liquid crystal layer, and a color filter substrate stacked on top of one another and is transparent to light for permitting light emitted from the light guide body 32 to be transmitted therethrough.

In this liquid crystal backlight device 30, light emitted from the LED lamp 31 is guided to the inclined surface 32C through the light guide body 32, and the light emitted from the LED lamp 31 is subjected to wavelength conversion in the phosphor layer 18 provided on the inclined surface 32C to produce white light which is transmitted through the liquid crystal panel 35 for illumination.

The liquid crystal backlight device 30 in the seventh embodiment of the invention is advantageous in that, in addition to the favorable effects explained above in connection with the first to sixth embodiments, an additional effect can be attained. Specifically, light guided through the light guide body 32 is subjected to wavelength conversion in the phosphor layer 18 provided on the backside of the liquid crystal backlight device 30 before emission to the outside of the backlight device. According to this construction, good brightness can be provided using blue light as a light source. Further, a transmitted illumination structure with good color rendering properties can be realized, and the backlight device can impart novel visuality as an illuminator for cellular phones (portable telephones) or equipment having a liquid crystal display part.

In the construction of the seventh embodiment, light emitted from the LED lamp 31 is reflected from the reflecting surface 32A, and the reflected light is then guided through the light guide body 32. Alternatively, a construction not provided with the reflecting surface 32A can be adopted. For example, instead of the reflecting surface 32A, a light incidence end face perpendicular to the bottom surface 32B is formed so that the direction of emitted light incident to the light guide body 32 is identical to the light guide direction.

Further, in addition to an LED lamp capable of emitting blue light, an LED lamp capable of emitting ultraviolet light can be used as the LED lamp 31.

INDUSTRIAL APPLICABILITY

As explained above, according to the invention, a phosphor, which produces broadband light emission in an orange-red or red spectrum region or produces light emission in a narrower band than in a dark red spectrum region with more than 650 nm is used to convert ultraviolet and blue radiations to a visible white radiation having a high level of color rendering properties. Therefore, in a blue or UV light emission constituting element, white light, which is novel in quality and has a spectrum close to natural light or incandescent lamp light, can be obtained with very high efficiency.

In a primary light emitting element which exhibits light emission at 300 to 500 nm, since a phosphor, which produces broadband light emission in an orange-red or red spectrum region or produces light emission in a narrower band than in a dark red spectrum region with more than 650 nm is used, an optical device which emits a visible white radiation with a high level of color rendering properties can be provided.

The invention claimed is:

1. A phosphor mixture for converting ultraviolet light or blue light emitted from a light emitting element into a visible white radiation, comprising:
   a first phosphor selected from a group consisting of an alkaline earth metal antimonate comprising a fluoroantimonate, and a derivative of the alkaline earth metal antimonate comprising a fluoroantimonate; and
   a second phosphor selected from a group consisting of a manganese(IV)-activated compound comprising an antimonate, a manganese (IV)-activated compound comprising a silicate-germinate, and a manganese(IV)-activated compound comprising an aluminate; and
   a third phosphor selected from a group consisting of a europium-activated silicate-germanate, and a sensitizer selected from a group consisting of Eu(II) and Mn(II) as a second activator and having an orange color, an orange-red color, or a dark red color in a spectrum range over 600 nm,
   wherein the third phosphor is represented by general formula $Me^I_x Me^{II}_y (B,Si,P)_a O_n X_m:Eu,Mn,$ wherein
   $Me^I$ comprises at least one element selected from group II and group III metals of the Periodic Table and/or at least one lanthanide ion selected from the group consisting of Eu, Pr, Sm, Gd, Dy, and Ce,
   $Me^{II}$ comprises at least one monovalent cation,
   X comprises Cl, F, or Br,
   $0 \leq x \leq 10$,
   $0 \leq y \leq 12$,
   $0 < a \leq 6$,
   $0 < n \leq 24$,
   $0 \leq m \leq 16$, and
   B may be completely or partially replaced with P, Si, Ga, or Al and may be partially replaced with V, Nb, Ta, Ge, W, or Mo, and
   wherein the phosphor mixture has different emission bands that is brought to a state of broad continuous emission of about 380 to 780 nm, the phosphor mixture having a color temperature of about 10,000 K with blue-white color to 6,500 K with daylight color and having a color temperature of about 3,000 K with warm white color to 2,000 K with twilight color of reddish yellow by virtue of the superposition of the emission band.

2. A phosphor mixture for converting ultraviolet or blue light emitted from the light emitting element according to claim 1 to a visible white radiation, wherein the alkaline earth metal antimonate is represented by general formula $Me^I_x Me^{II}_y Sb_a O_b X_c$ wherein:
   $Me^I$ comprises at least an element selected from a group consisting of calcium (Ca), strontium (Sr), barium (Ba), cadmium (Cd), zinc (Zn), beryllium (Be), magnesium (Mg), europium (Eu), manganese (Mn), scandium (Sc), yttrium (Y), lanthanum (La), samarium (Sm), praseodymium (Pr), dysprosium (Dy), and terbium (Tb),
   $Me^{II}$ comprises at least one element selected from the group consisting of lithium (Li), sodium (Na), potassium (K), rubidium (Rb), and cesium (Cs);
   X represents at least one element selected from a group consisting of fluorine (F), chlorine (CO, and bromine (Br);
   x=0 to 8;
   y=0 to 4;
   $0 < a < 16$;
   $0 \leq b \leq 64$;
   $0 \leq c \leq 4$; and
   Sb comprises at least one element selected from a group consisting of antimony (Sb), vanadium (V), niobium (Nb), tantalum (Ta), phosphorus (P), arsenic (As), titanium (Ti), zirconium (Zr), hafnium (Hf), silicon (Si), germanium (Ge), molybdenum (Mo), or tungsten (W), and a derivative of at least one of said elements.

3. A phosphor mixture for converting ultraviolet or blue light emitted from the light emitting element according to claim 1 to a visible white radiation, wherein the alkaline earth metal antimonate emits light in a red spectrum region with a maximum emission wavelength of about 600 to 670 nm.

4. A phosphor mixture for converting ultraviolet or blue light emitted from the light emitting element according to claim 1 to a visible white radiation, wherein white light having color rendering Ia and a color rendering index Ra>90 is produced by a combination of a radiation emitted from the phosphor with a primary radiation emitted from a light emitting element capable of constituting a semiconductor element or a gas discharge lamp and, thus, this element can be used as a background illumination device and in lighting in a living space and furnishings, in photography and microscopic examination, in medical technology, and in lighting technology in museums and any place where a very authentic color rendering is important.

5. A phosphor mixture for converting ultraviolet or blue light emitted from the light emitting element according to claim 1 to a visible white radiation, wherein said phosphor is applied, either solely or as a mixture of other phosphor, as a layer in a light emitting element and white light with color rendering Ia is produced by a combination of a primary radiation emitted from said light emitting element with a radiation emitted from the layer of the phosphor.

6. A phosphor mixture for converting ultraviolet or blue light emitted from the light emitting element according to claim 1 to a visible white radiation, wherein said light emitting element used comprises an LED for emitting a primary radiation in an ultraviolet spectrum region with more than 300 nm or a violet or blue spectrum region with more than 380 nm.

7. An optical device, comprising:
a phosphor mixture adapted to be excited to emit light based on light emitted from an LED element,
wherein the phosphor mixture comprises:
a first phophor selected from a group consisting of an alkaline earth metal antimonate comprising a fluoroantimonate and a derivative of the alkaline earth metal antimonate comprising a fluoroantimonate; and
a second phosphor selected from a group consisting of a manganese(IV)-activated compound comprising an antimonate, a manganese (IV)-activated compound comprising a titanate, a manganese (IV)-activated compound comprising a silicate-germanate, and a manganese (IV)-activated compound comprising an aluminate; and
a third phosphor selected from a group consisting of a europium-activated silicate-germanate and a sensitizer selected from a croup consisting of Eu(II) and Mn(II) as a secondary activator and having an orange color an orange-red color a red color, or a dark red color in a spectrum range over 600 nm,
wherein the third phosphor is represented by general formula $Me^I_x Me^{II}_y (B,Si,P)_a O_n X_m :Eu,Mn,$ wherein
$Me^I$ comprises at least one element selected from group II and group III metals of the Periodic Table and/or at least one lanthanide ion selected from the group consisting of Eu, Pr, Sm, Gd, Dy, and Ce,
$Me^{II}$ comprises at least one monovalent cation,
X comprises Cl, F, or Br,
$0 \leq x \leq 10$,
$0 \leq y \leq 12$,
$0 < a \leq 6$,
$0 < n \leq 24$,
$0 \leq m \leq 16$, and
B may be completely or partially replaced with P, Si, Ga, or Al and may be partially replaced with V, Nb, Ge, W, or Mo, and
wherein the phosphor, mixture has different emission bands that is brought to a state of bread continuous emission of about 380 to 780 nm, the phosphor mixture having a color temperature of about 10,000 K with bluewhite color to 6,500 K with daylight color and having a color temperature of about 3,000 K with warm white color to 2,000 K with twilight color of reddish yellow by virtue of the superposition of the emission band.

8. An optical device, comprising:
an LED element;
a power feeding part for mounting said LED element thereon and feeding power to said LED element;
a light transparent sealing part for sealing said LED element and said power feeding part integrally with each other; and
a phosphor mixture for emitting light upon excitation based on light emitted from said LED element,
wherein the phosphor mixture comprises:
a first phosphor selected from a group consisting of an alkaline earth metal antimonate comprising a fluoroantimonate and a derivative of the alkaline earth metal antimonate comprising a fluoroantimonate; and
a second phosphor selected from a group consisting of manganese(IV)-activated compound comprising an antimonate, a manganese(IV)-activated compound comprising a titanate, a manganese(IV)-activated compound comprising a silicate-germanate, and a manganese(IV)-activated compound comprising an aluminate; and
a third phosphor selected from a group consisting of a europium-activated silicate-germanate and a sensitizer selected from a group consisting of Eu(II) and Mn(II) as a secondary activator and having an orange color, an orange-red color, a red color, or a dark red color in the spectrum range over 600 nm,
wherein the third phosphor is represented by general formula:

$Me^I_x Me^{II}_y (B,Si,P)_a O_n X_m :Eu,Mn,$ wherein
$Me^I$ comprises at least one element selected from group II and group III metals of the Periodic Table and/or, at least one lanthanide ion selected from the group consisting of Eu, Pr, Sm, Gd, Dy, and Ce,
$Me^{II}$ comprises at least one monovalent cation,
X comprises Cl, F, or Br,
$0 \leq x \leq 10$,
$0 \leq y \leq 12$,
$0 < a \leq 6$,
$0 < n \leq 24$,
$0 \leq m \leq 16$, and
B may be completely or partially replaced with P, Si, Ga, or Al and may be partially replaced with V, Nb, Ta, Ge, W, or Mo, and
wherein, the phosphor mixture has different emission bands that is brought to a state of broad continuous emission of about 380 to 780 nm, the phosphor mixture having a color temperature of about 10,000 K with bluewhite color to 6,500 K with daylight color and having a color temperature of about 3,000 K with warm white color to 2,000 K with twilight color of reddish yellow by virtue of the superposition of the emission band.

9. An optical device, comprising:
an LED lamp;
a light guiding part for guiding light emitted from said LED lamp;
a phosphor mixture for emitting light upon excitation based on light guided through said light guiding part; and
a part to be lighted based on light emitted through said phosphor mixture,
wherein said phosphor mixture consists of:
a first phosphor selected from a group consisting of: an alkaline earth metal antimonate comprising a fluoroantimonate or a derivative of the alkaline earth metal antimonate comprising a fluoroantimonate; and
a second phosphor selected from a group consisting of a manganese(IV)-activated compound consisting of an antimonate, a manganese(IV)-activated compound consisting of a titanate, a manganese(IV)-activated compound consisting of a silicate-germanate, and a manganese(IV)-activated compound consisting of an aluminate; and a third phosphor selected from a group consisting of a europium-activated silicate-germanate and a sensitizer selected from a group consisting of Eu(II), and Mn(II) as a secondary activator and having an orange color, an orange-red color, a red color, or a dark red color in the spectrum range over 600 nm, wherein the third phosphor is represented by general formula:

$$Me^I_x Me^{II}_y (B,Si,P)_a O_n X_m : Eu, Mn,$$

wherein $Me^I$ comprises at least one element selected from group II and group III metals of the Periodic Table and/or at least one lanthanide ion selected from the group consisting of Eu, Pr, Sm, Gd, Dy, and Ce, $Me^{II}$ comprises at least one monovalent cation, X comprises Cl, F, or Br, $0 \leq x \leq 10$, $0 \leq y \leq 12$, $0 < a \leq 6$, $0 < n \leq 24$, $0 \leq m \leq 16$, and B may be completely or partially replaced with P, Si, Ga, or Al and may be partially replaced with V, Nb, Ta, Ge, W, or Mo, and wherein the phosphor mixture has different emission bands that is brought to a state of broad continuous emission of about 380 to 780 nm, the phosphor mixture having a color temperature of about 10,000 K with blue-white color to 6,500 K with daylight color and having a color temperature of about 3,000 K with warm white color to 2,000 K with twilight color of reddish yellow by virtue of the superposition of the emission hand.

10. An optical device according to claim 7, wherein said phosphor mixture further comprises a light emitting alkaline earth metal antimonate represented by general formula $$Me^I_x Me^{II}_y Sb_a O_b X_c$$

wherein $Me^I$ comprises at least one element selected from the group consisting of calcium (Ca), strontium (Sr), barium (Ba), cadmium (Cd), zinc (Zn), beryllium (Be), magnesium (Mg), europium (Eu), manganese (Mn), scandium (Sc), yttrium (Y), lanthanum (La), samarium (Sm), praseodymium (Pr), dysprosium (Dy), and terbium (Tb), $Me^{II}$ comprises at least one element selected from the group consisting of lithium (Li), sodium (Na), potassium (K), rubidium (Rb), and cesium (Cs), X (uppercase letter) represents at least one element selected from the group consisting of fluorine (F), chlorine (Cl), and bromine (Br), x (lowercase letter)=0 (zero) to 8, y=0 to 4, $0 < a < 16$, $0 < b < 64$, $0 \leq c \leq 4$, and a part of antimony (Sb) may be replaced with vanadium (V), niobium (Nb), tantalum (Ta), phosphorus (P), arsenic (As), titanium (Ti), zirconium (Zr), hafnium (Hf), silicon (Si), germanium (Ge), molybdenum (Mo), or tungsten (W), or alternatively may contain a system derived from them, for example, a fluoroantimonate.

11. The optical device according to claim 7, wherein said phosphor mixture further comprises an alkaline earth metal antimonate which exhibits intrinsic photoemission and emits light in a red spectrum region with a maximum emission wavelength of about 600 to 670 nm.

12. The optical device according to claim 8, wherein said phosphor mixture is included in said light transparent sealing resin for sealing said LED element.

13. The optical device according to claim 8, wherein said phosphor mixture comprises a thin-film phosphor layer that is sealed with said light transparent glass.

14. The optical device according to claim 12, wherein said phosphor mixture is planar.

15. The optical device according to claim 8, wherein said phosphor mixture is provided on a surface of the sealing resin having an optical shape that radiates light emitted from said LED element in a desired lighting area.

16. The optical device according to claim 7, wherein said phosphor mixture is excited upon exposure to blue light and/or ultraviolet light with wavelengths ranging from 300 nm to 500 nm.

17. The phosphor mixture according to claim 1, wherein the derivative of the alkaline earth metal antimonate comprises a compound selected from a group consisting of a calcium metantimonate, a calcium pyroantimonate, and a calcium fluoroantimonate.

\* \* \* \* \*

UNITED STATES PATENT AND TRADEMARK OFFICE
CERTIFICATE OF CORRECTION

| | | |
|---|---|---|
| PATENT NO. | : 7,828,993 B2 | Page 1 of 1 |
| APPLICATION NO. | : 10/539248 | |
| DATED | : November 9, 2010 | |
| INVENTOR(S) | : Gundula Roth et al. | |

It is certified that error appears in the above-identified patent and that said Letters Patent is hereby corrected as shown below:

Title Page should read

(73) Assignees: Toyoda Gosei Co., Ltd., Nishikasugai-gun, Aichi (JP); Gundula Roth, Levenhagen (DE); Walter Tews, Greifswald (DE)

In particular, it is requested that claims 1, 2 and 7 be corrected as follows:

claim 1, at column 23, line 53, change "a second activator" to --a secondary activator--;

claim 2, at column 24, line 38, change "$0 \leqq b \leqq 64$" to --$0 < b < 64$--;

claim 7, at column 25, line 51, change "the phosphor, mixture" to --the phosphor mixture-- ;

claim 7, at column 25, line 52, change "a state of bread continuous" to --a state of broad continuous--.

Signed and Sealed this
Twenty-ninth Day of March, 2011

David J. Kappos
*Director of the United States Patent and Trademark Office*